US012787775B2

(12) United States Patent
Lin

(10) Patent No.: US 12,787,775 B2
(45) Date of Patent: Nov. 3, 2026

(54) SEMICONDUCTOR PACKAGE STRUCTURE HAVING THERMAL MANAGEMENT STRUCTURE

(71) Applicant: Chun-Ming Lin, Hsinchu County (TW)

(72) Inventor: Chun-Ming Lin, Hsinchu County (TW)

( * ) Notice: Subject to any disclaimer, the term of this patent is extended or adjusted under 35 U.S.C. 154(b) by 0 days.

(21) Appl. No.: 19/534,714

(22) Filed: Feb. 9, 2026

(65) Prior Publication Data

US 2026/0182373 A1 Jun. 25, 2026

Related U.S. Application Data

(62) Division of application No. 18/779,081, filed on Jul. 22, 2024, now Pat. No. 12,575,412, which is a (Continued)

(51) Int. Cl.

| | |
|---|---|
| ***H10W 40/25*** | (2026.01) |
| ***H10W 40/22*** | (2026.01) |
| ***H10W 72/20*** | (2026.01) |
| ***H10W 72/30*** | (2026.01) |
| ***H10W 72/90*** | (2026.01) |
| ***H10W 74/10*** | (2026.01) |

(Continued)

(52) U.S. Cl.

CPC ......... *H10W 40/258* (2026.01); *H10W 40/22* (2026.01); *H10W 72/20* (2026.01); *H10W 72/30* (2026.01); *H10W 72/90* (2026.01); *H10W 74/111* (2026.01); *H10W 90/00* (2026.01); *H10W 72/29* (2026.01); *H10W 72/923* (2026.01); *H10W 72/952* (2026.01); *H10W 90/722* (2026.01); *H10W 90/724* (2026.01); *H10W 90/736* (2026.01)

(58) Field of Classification Search

CPC ... H10W 40/258; H10W 40/22; H10W 72/20; H10W 72/30; H10W 72/90; H10W 74/111; H10W 90/00; H10W 72/29; H10W 72/923; H10W 72/952; H10W 90/722; H10W 90/724; H10W 90/736

See application file for complete search history.

(56) References Cited

U.S. PATENT DOCUMENTS

| | | | | |
|---|---|---|---|---|
| 7,429,792 B2 * | 9/2008 | Lee | H10W 90/00 | 257/E23.102 |
| 8,110,910 B2 * | 2/2012 | Kim | H10W 74/019 | 438/109 |

(Continued)

FOREIGN PATENT DOCUMENTS

| | | |
|---|---|---|
| JP | 1974040386 B | 11/1974 |
| JP | 2009117464 A | 5/2009 |
| JP | 2012142572 A | 7/2012 |

OTHER PUBLICATIONS

Office Action dated May 26, 2026 issued by the Japanese Patent Office for JP application No. 2023-119-065 (totally 5 pages).

*Primary Examiner* — Andres Munoz

(74) *Attorney, Agent, or Firm* — WPAT, P.C.; Anthony King

(57) ABSTRACT

The present disclosure provides a package structure. The package structure includes: a first die, a second die arranged over the first die, an under-bump metallization (UBM) layer covering a back surface of the second die and a side surface of the first die (1712); and a first through via extending through the first die and the second die, wherein a top of the first through via is coupled to the UBM layer.

9 Claims, 24 Drawing Sheets

Related U.S. Application Data division of application No. 18/333,130, filed on Jun. 12, 2023, now Pat. No. 12,087,662.

(51) Int. Cl.

| | |
|---|---|
| ***H10W 90/00*** | (2026.01) |
| *H10W 72/29* | (2026.01) |

(56) References Cited

U.S. PATENT DOCUMENTS

| | | | | |
|---|---|---|---|---|
| 8,569,887 | B2 * | 10/2013 | Hwang | H10W 20/425<br>257/E23.141 |
| 9,129,929 | B2 * | 9/2015 | Lundberg | H10W 40/00 |

* cited by examiner

SEMICONDUCTOR PACKAGE STRUCTURE HAVING THERMAL MANAGEMENT STRUCTURE

CROSS REFERENCE TO RELATED APPLICATIONS

The present application is a divisional application of U.S. non-provisional application Ser. No. 18/779,081 filed Jul. 22, 2024, which is a divisional application of U.S. non-provisional application Ser. No. 18/333,130 filed Jun. 12, 2023, now U.S. Pat. No. 12,087,662 B1, disclosures of which are herein incorporated by reference in its entirety. Further, the specification and drawings set forth in U.S. non-provisional application Ser. No. 17/697,937, filed Mar. 18, 2022 and entitled "CONDUCTIVE STRUCTURE INCLUDING COPPER-PHOSPHOROUS ALLOY AND A METHOD OF MANUFACTURING CONDUCTIVE STRUCTURE", and the specification and drawings set forth in U.S. non-provisional application Ser. No. 17/815,613, filed Jul. 28, 2022 and entitled "INTERCONNECT STRUCTURE AND MANUFACTURING METHOD FOR THE SAME," are herein incorporated by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, the functional density (i.e., the number of interconnected devices per die area) has generally increased while the geometry size (i.e., the smallest component (or line) that can be created using a fabrication process) has decreased. This scaling down process generally provides benefits by increasing production efficiency.

Semiconductor devices and integrated circuits are widely used in a variety of electronic applications, such as cell phones and other electronic equipment. The dies of the wafer may be processed and packaged with other semiconductor devices or dies at the wafer-level, and various technologies have been developed for the wafer-level packaging. For example, wafer-level packaging faces a lot of issues that need to be addressed.

Poor thermal dissipation and lack of ability to achieve thermal management are major issues for semiconductor structures and microelectronics packages. Semiconductor structures and microelectronics packages may have localized overheating that are undesirable for the yield, performance and reliability of the electronic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
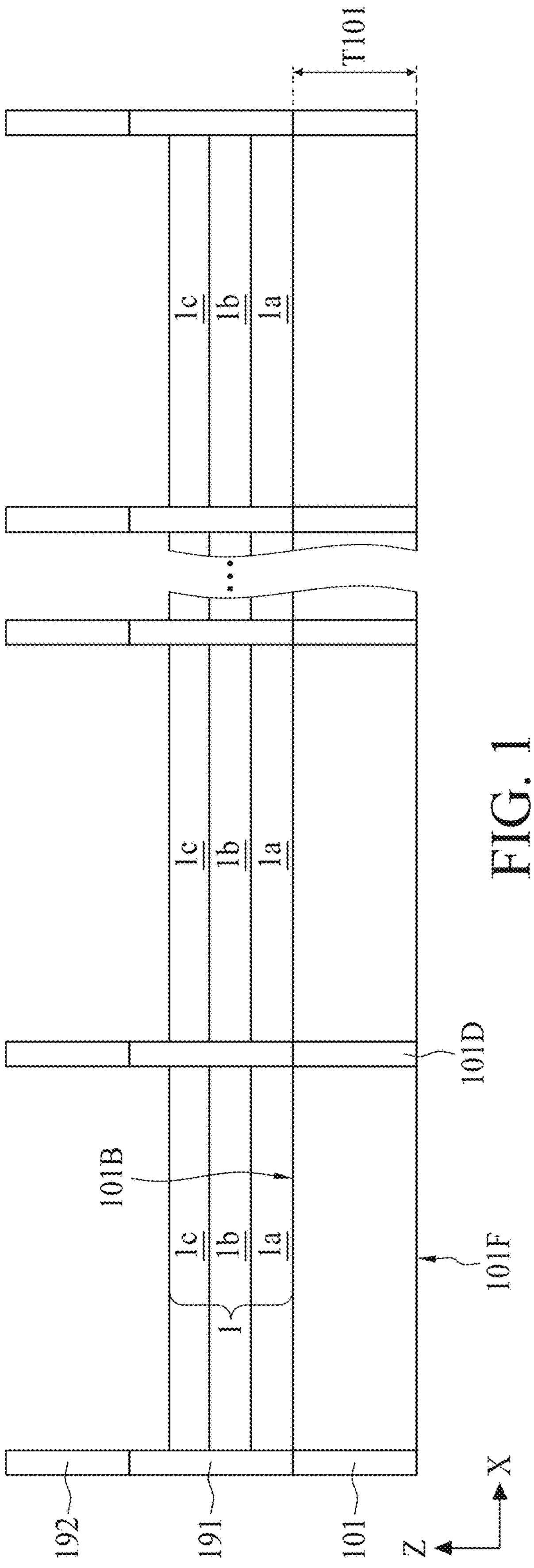
FIG. 1 is a cross-sectional view of a semiconductor structure during intermediate stages of manufacturing operations, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms “approximately,” “substantially,” “substantial” and “about” are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be “substantially” the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, “substantially” parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, “substantially” perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The issue of poor thermal dissipation is commonly found amid electronic devices. Specifically, it is difficult to apply conventional thermal dissipation sheets in advanced package structures or other electronic devices due to the large size, large weight and great thickness of conventional thermal dissipation sheets, which may defy the trend of scaling down the size of electronic devices. Further, conventional thermal dissipation sheets are too heavy, thereby causing reliability issue with adjacent microelectronic devices that may include advanced technology features with lower strain/stress tolerance. In other comparative embodiments, conventional thermal interface materials (TIMs, such as thermal dissipation paste) are prone to reliability issues. Especially, TIMs may rupture under a dry condition, while TIMs may generate bubbles (which may further cause cracks) under a humid condition. Such issues especially hinder the application of TIMs in automotive electronics, avionic electronics, or other industries that have very high requirement regarding reliability. In other comparative embodiments, using substantially pure copper as thermal dissipation sheet may face the issue of oxidization of copper, which is prone to face reliability issues.

Therefore, the present disclosure provides thermal management structures that are highly compatible to various types of devices, and may be smaller, thinner, and lighter. Particularly, copper-phosphorous alloy (such as $Cu_3P$) can be incorporated into thermal dissipation structures in various type of applications, such as semiconductor device, packages, wafers, wafer substrate, Integrated Circuit (IC), Printed Circuit Board (PCB), interposer, redistribution layer, core substrate, coreless substrate, ceramic substrate, bonding structures, bumping structures, or the like. In some embodiments, the copper-phosphorous alloy layer may be formed by performing an electroless plating or electroplating operation. U.S. application Ser. No. 17/697,937, entitled “Conductive structure including copper-phosphorous alloy and a method of manufacturing conductive structure,” is hereby incorporated by reference in its entirety. The details of the plating techniques can be found by referring to the aforesaid incorporated references. For example, the copper-phosphorous alloy may be formed by providing a phosphorus-based chemical and a copper-based chemical in a plating solution, wherein the phosphorus-based chemical can be one of the following chemicals: phosphine ($PH_3$), phosphoryl chloride ($POCl_3$), or phosphorus trichloride ($PCl_3$). In contrast, the copper-based chemical can be one of the following chemicals: copper(II) sulfate ($CuSO_4$), or copper(II) pyrophosphate ($Cu_2P_2O_7$). In some embodiments, the copper-phosphorous alloy formed may exhibit improved quality and wettability, thereby further improving device performance.

In the present disclosure, a means for thermal management are provided for various types of package structures or semiconductor structures, as respectively discussed with reference to FIG. 1 to FIG. 14. Some embodiments provide a package structure, with the thermal management structures electroplated on the back of the dies, in a better and well-known Top-Side Cooling (TSC) manner instead of the Bottom-Side Cooling (BSC) method. Thus the thermal management of this structure can be improved (since the thermal resistance of the leads is much higher compared to the exposed package top side) wherein means for thermal management may help improve thermal dissipation, as well as conduct heat away to alleviate local overheating issues (such as for a high-voltage power device to prevent a temperature of certain position of a device to be over a threshold value, slowing down an increase rate of the temperature, as well as to increase the reliability).

Furthermore, in the present disclosure, copper-phosphorous alloy (such as $Cu_3P$) has a more condensed structure, and can improve anti-corrosion, wear resistance, wettability, strength, toughness, conformability, processability, et cetera. Furthermore, the thermal dissipation structure that includes copper-phosphorous alloy (such as $Cu_3P$) exhibits greater thermal conductivity and electrical conductivity compared to conventional thermal dissipation plates and conventional thermal interface materials (such as thermal dissipation paste).

The copper(I) phosphide ($Cu_3P$) in the present disclosure may include the nonstoichiometric compounds $Cu_{3-x}P$, where in some embodiments, x can be less than 0.1 to become copper-deficient $Cu_3P$. In other words, the phosphorous constituent (for example, calculated by weight percentage) in the copper(I) phosphide can be in a range of from about 13.98% to about 14.39%.

The aforesaid advantages of copper-phosphorous alloy (especially $Cu_3P$) provide better overall device performance and such high compatibility with the fabrication operations of the semiconductor structure may allow more potential for altering configurations of the package structures that can further enhance device properties. In some cases, lack of conformability and processability of conventional thermal dissipation device limits the potential of application in the packaging techniques.

The present disclosure utilizes plating operation for forming copper-phosphorous alloy (especially $Cu_3P$), which can be compatible with various types of processes for forming semiconductor devices, packages, wafers, a wafer substrate, a PCB, an IC, an interposer, a redistribution layer, a core substrate, a coreless substrate, a ceramic substrate, bonding structures, bumping structures, or the like.

In some embodiments, copper-phosphorous (which may include $Cu_3P$) can be formed by techniques of electroless plating or electroplating. Electroless plating (also can be referred to as chemical plating or autocatalytic plating) is a type of technique that creates metal or metal-containing alloy coatings on various materials by autocatalytic chemical reduction of metal cations in a liquid bath, wherein a workpiece to be plated is immersed in a reducing agent that, when catalyzed by certain materials, changes metal ions to metal that forms a coating on the workpiece. Generally, advantages of the electroless plating technique include compatibility and product quality. In some cases, the electroless plating technique can be applied to both of a conductive workpiece and a non-conductive workpiece, and also applicable to the workpiece with smaller size or smaller surface area. Furthermore, the coating layer formed by the electroless plating technique may exhibit greater anti-corrosion and/or greater wear resistance as compared to the electroplating technique.

In contrast, electroplating is a technique for forming metal coatings on various materials by applying externally generated electric current. The advantages of the electroplating technique include higher efficiency and greater throughput.

Generally, it is easier to control a thickness of copper-phosphorous by using the electroless plating or electroplating operation, and even in the case that a thermal management structure including copper-phosphorous has a lower thickness, such film still exhibits excellent property of heat management.

An embodiment of a semiconductor structure, that includes a thermal management structure 1, which includes an adhesion layer 1*a*, a diffusion barrier layer 1*b* over the adhesion layer 1*a*, and a copper-phosphorous alloy layer 1*c* (which may include $Cu_3P$) over the diffusion barrier layer 1*b*, will be subsequently discussed with reference to FIG. 1.

Referring to FIG. 1, FIG. 1 is a cross-sectional view of a semiconductor structure during intermediate stages of manufacturing operations, in accordance with some embodiments of the present disclosure. A substrate 101 is provided, wherein the substrate 101 includes a front surface 101F and a back surface 101B facing away from the front surface 101F.

In some embodiments, the substrate 101 is thinned to a predetermined thickness, for example, the substrate 101 is thinned until a thickness T101 of the substrate 101 is in a range from about 20 μm to about 50 μm. In some embodiments, a predetermined dicing area 101D is defined in the substrate 101, wherein the substrate 101 can be split in accordance with the dicing area 101D subsequently. In some embodiments, a half-cut dicing operation is performed to create grooves that extend to a position at a middle of the substrate 101, wherein each portions of the substrate 101 are temporarily not separated yet. In some alternative embodiments, scribe lines can be formed at the substrate to define the areas that will be diced subsequently.

In some embodiments, the substrate 101 is flipped upside down for photolithographic processes. That is, the back surface 101B of the substrate 101 is facing upward. A lift-off method is applied to deposit the thermal management structure 1 on the back surface 101B and around the periphery of the dies on the substrate 101. A photoresist layer 191, which may be also a dry film to serve as a protection layer, is formed over the back surface 101B of the substrate 101, wherein the photoresist layer 191 may include a negative photoresist of an epoxy-based photoresist material (such as SU-8 photoresist, or the like) or a positive photoresist of polymer material (such as Polymethyl methacrylate (PMMA), or the like). Note that the resolution of the positive photoresist is better than the negative photoresist, but it needs electron-beam lithography to change the positive photoresist into a negative photoresist.

The photoresist layer 191 can be partially removed to expose at least a portion of the back surface 101B of the substrate 101. In some embodiments, a remained portion of the photoresist layer 191 may overlap the dicing area 101D (or the scribe line). Then, a thermal management structure 1 is formed over the exposed portion of the back surface 101B of the substrate 101. In some embodiments, the thermal management structure 1 includes copper-phosphorous alloy (such as $Cu_3P$).

In some embodiments, the formation of the thermal management structure 1 includes forming an adhesion layer 1*a* over the exposed portion of the back surface 101B of the substrate 101, forming a diffusion barrier layer 1*b* over the adhesion layer 1*a*, and forming a copper-phosphorous alloy layer 1*c* (which may include $Cu_3P$) over the diffusion barrier layer 1*b*. In some embodiments, during the formation of the thermal management structure 1, a composite metal layer 192, which includes a portion of the adhesion layer 1*a*, the diffusion barrier layer 1*b* and the copper-phosphorous alloy layer 1*c*, is also formed or deposited at the same time on the top portions of the photoresist layers 191.

In some embodiments, the adhesion layer 1*a* is configured to alleviate lattice mismatch issue caused by underlying silicon surface (that is, the exposed portion of the back surface 101B of the substrate 101), such as by eutectic bonding. Therefore, the adhesion layer 1*a* can enhance the adhesion between the thermal management structure 1 and the substrate 101. The adhesion layer 1*a* may include at least one of (a) a conductive layer, e.g., a metal layer (such as Ag, Al, Au, et cetera) that has a lattice constant relatively closer to that of silicon, (b) a metal silicide layer (such as nickel silicide, cobalt silicide, palladium silicide, et cetera), which may have a thickness being in a range from 0.1 μm to about 0.6 μm, or (c) a wetting layer (such as a nickel seeding layer, or the like), wherein the lattice mismatch between nickel and silicon can be lowered to around 0.4%, and an adhesion force between nickel and silicon may be adequate. In some embodiments, the use of the adhesion layer 1*a* may help overcome the reliability issue (such as peeling) when the copper-phosphorous alloy is incorporated into the semiconductor device.

In some embodiments, in the cases of the adhesion layer 1*a* including nickel seeding layer, a thickness of the adhesion layer 1*a* may be in a range from about 0.5 μm to about 2 μm. In addition, the nickel seeding layer may be formed by: forming a nickel layer over the underlying silicon surface (that is, the exposed portion of the back surface 101B of the substrate 101), and annealing the nickel layer and the substrate 101 to change the property of an interface between the nickel layer and the substrate 101. In some embodiments, the annealing operation may include using excimer laser annealing operation (which may use laser gas, such as XeF, XeCl, KrF, KrCl, ArF, fluorine gas, or the like). Under the annealing operation, $Ni_2Si$ (which has a higher nickel concentration) proximal to the interface between the nickel layer and the substrate 101 may be converted to NiSi, and a portion of NiSi may be further converted to $NiSi_2$, which provide a greater adhesion bonding compared to $Ni_2Si$.

The diffusion barrier layer 1*b* can be utilized to alleviate diffusion, and may be able to decrease internal stress. In some embodiments, the diffusion barrier layer 1*b* may include at least one of (a) a cobalt phosphorus (CoP) layer, which may be formed by techniques of electroless plating, and may have a thickness in a range from about 0.1 μm to about 0.6 μm, (b) a nickel layer, which can be formed by electroless plating operation, and may have a thickness in a range from about 0.5 μm to about 2 μm, or (c) a refractory metal layer, metal nitride derivatives or metal alloy (such as Ti, W, Mo, Ta, V, titanium tungsten, TiW nitride, $W_2N$, TiN, TaN, et cetera), which can be formed by physical vapor deposition (PVD), and may have a thickness in a range from about 0.1 μm to about 0.5 μm. Specifically, cobalt phosphorus (CoP) layer exhibits greater step coverage compared to materials that are formed by PVD operation, and exhibits great ability to hinder diffusion. On the other hands, refractory metal layer, metal nitride derivatives or metal alloy (such as Ti, W, Mo, Ta, V, titanium tungsten, TiW nitride, $W_2N$, TiN, TaN, et cetera) exhibit greater thermal conductivity while hindering diffusion under elevated temperature.

The copper-phosphorous alloy layer 1*c* exhibits greater thermal conductivity compared to conventional thermal dissipation plates and conventional thermal interface materials, and has a more condensed structure, and can improve anti-corrosive, wear resistance, wettability, strength, toughness, conformability, processability, et cetera.

Further, the lift-off method is applied to remove the photoresist layer 191. Not only the photoresist layer 191 but the deposited three layers of composite metal layer 192 (1*a*, 1*b*, and 1*c*) can also be removed, and only those three layers of 1*a*, 1*b*, and 1*c* are remained on each die. Then the substrate 101 is separated into a plurality of dies by a dicing operation. For example, the dicing operation is a full-cut dicing operation and can be performed in accordance with the dicing area 101D or scribe lines. In some embodiments, the dicing operation is performed by using a diamond cutter or laser. After performing the dicing operation, separated portions of substrate 101 (which can be dies) having the thermal management structure 1 disposed over the back surface 101B is obtained. As previously discussed, the thermal management structure 1 may facilitate the thermal management regarding thermal dissipation. The thermal management structure 1 exhibits excellent thermal conductivity, the ability to hinder diffusion, great adhesion on silicon surface, lighter weight, as well as smaller size (such as smaller thickness). Also, the operations for forming the thermal management structure 1 is highly compatible with other ordinary operations for forming other electronic devices.

An embodiment of semiconductor structure that includes a thermal management structure 1 will be subsequently discussed with reference to FIG. 2. Specifically, the thermal management structure 1 discussed with reference to FIG. 2 further includes a corrugated profile at a top surface that is facing away from the substrate 101. That is, the thermal management structure 1 included a plurality of protrusions 1*d*. In some embodiments, the corrugated profile of the thermal management structure 1 includes a planar portion 1*c* and a corrugated portion 1*d* over the planar portion 1*c*.

A photoresist layer is patterned over the copper-phosphorous alloy layer 1*c* of the thermal management structure 1, wherein the photoresist layer may include an epoxy-based photoresist material (such as SU-8 photoresist, or the like) or polymer material (such as Polymethyl methacrylate (PMMA), or the like). In some embodiments, the photoresist layer is patterned into several protruding sections 1*d* (which is similar to a corrugated top profile), wherein at least a portion of the copper-phosphorous alloy layer 1*c* is exposed from the photoresist layer.

In some embodiments, a copper-phosphorous alloy material layer 1*d* is formed over the thermal management structure 1 and the photoresist layer by using electroless plating operation with thickness less than 1 μm. In addition, the copper-phosphorous alloy layer 1*d* can also be formed by an electroplating operation with thickness less than 200 μm to obtain a denser structure, and a thicker layer with improve efficiency. In some embodiments, a profile of the copper-phosphorous alloy material layer 1*d* conforms to a surface profile of the thermal management structure 1 and the photoresist layer. In some embodiments, the copper-phosphorous alloy material layer 1*d* includes a portion over the exposed portion of the copper-phosphorous alloy layer 1*c*, and another portion over the photoresist layer.

A photoresist removal operation is performed. Note the photoresist removal operation hereby performed utilizes of a negative photoresist such as polyisoprene rubber or a positive resist such as Novolac resin or their equivalents as the photoresist, which are capable of forming a thinner layer compared to the conventional epoxy-based photoresist material (such as SU-8, PMMA, or the like), and completing a lift-off operation to remove the photoresist layer and the portion of the copper-phosphorous alloy material layer directly above the photoresist layer. After the photoresist removal operation, a portion of the copper-phosphorous alloy material layer is remained, wherein the remained portion is hereinafter referred to as protrusions 1*d*. The protrusions 1*d* includes copper-phosphorous alloy (such as $Cu_3P$).

Furthermore, a portion of the copper-phosphorous alloy layer 1*c* may be exposed from the protrusions 1*d*. The copper-phosphorous alloy layer 1*c* and the protrusions 1*d* can be collectively referred to as a thermal conductive layer 1X, which has a corrugated profile. Further, the thermal management structure 1 (for example, which may include the adhesion layer 1*a*, the diffusion barrier layer 1*b*, the copper-phosphorous alloy layer 1*c*) and the protrusions 1*d* can be collectively referred to as the thermal management module 1Y, and the discussion of the adhesion layer 1*a*, the diffusion barrier layer 1*b*, and the copper-phosphorous alloy layer 1*c* can be found by referring to discussions with respect to FIG. 1. In some embodiments, a further etching operation can be performed to form recesses or hollow structures in the thermal management structure 1, thereby increasing a surface area and facilitate the ability to dissipate heat. In some embodiments, repeating the operations discussed with reference to FIG. 2 can increase the height of protrusions 1*d*.

An embodiment of method(s) for forming a die will be subsequently discussed with reference to FIG. 3 and FIG. 4. Specifically, a thermal management structure 1, a copper-phosphorous alloy material layer 2 (see FIG. 4), and heat spreaders 3 are incorporated into the semiconductor structure discussed with reference to FIG. 3 and FIG. 4 in order to facilitate the ability of thermal dissipation. The overall bottom area of the heat spreaders 3 can be larger than the die area 101D.

Figure 3:
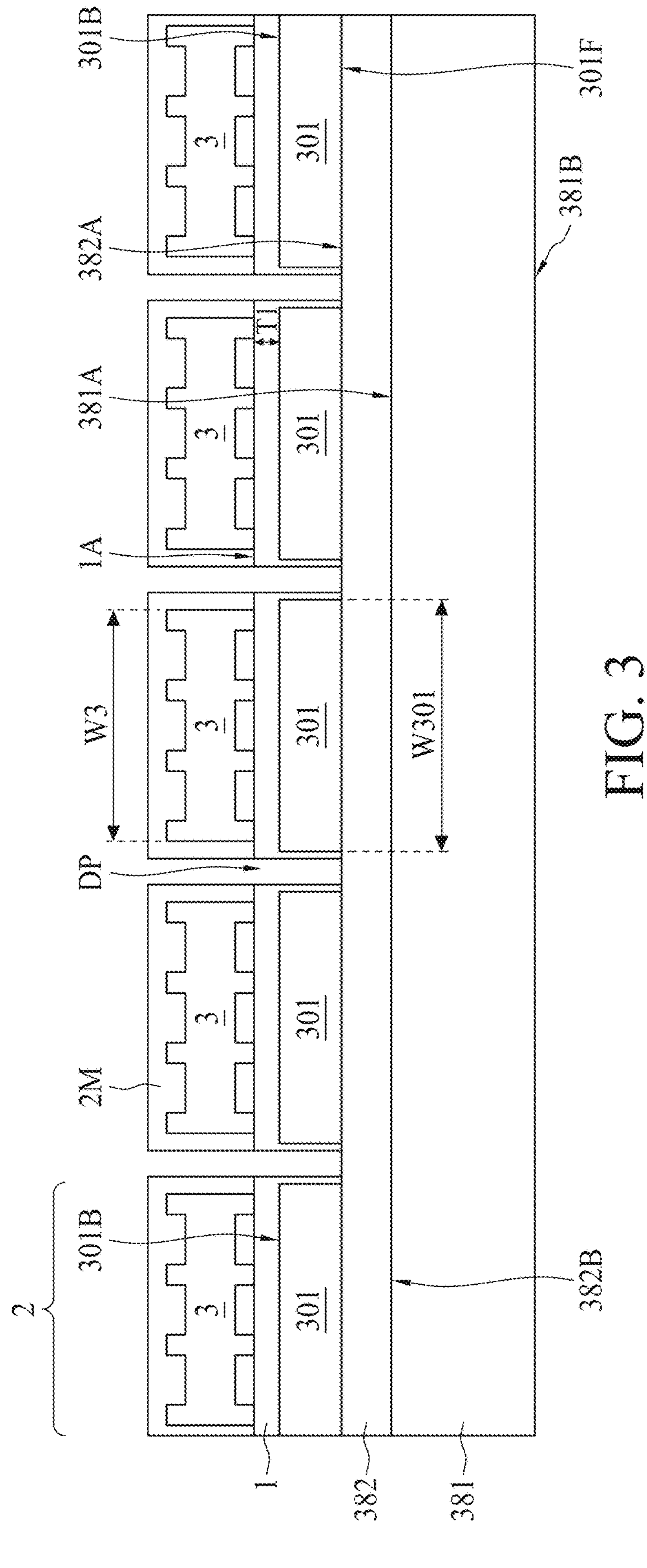
FIG. 3 and FIG. 4 are cross-sectional views of a semiconductor structure during intermediate stages of manufacturing operations, in accordance with some embodiments of the present disclosure.

Referring to FIG. 3, FIG. 3 is a cross-sectional view of a semiconductor structure during intermediate stages of manufacturing operations, in accordance with some embodiments of the present disclosure. A carrier 381 having a first surface 381A and a second surface 381B opposite to the first surface 381A is received. In some embodiments, the carrier 381 is made of a material that has adequate hardness or mechanical strength. For example, the carrier 381 may be made of glass. A tape 382 is attached to the first surface 381A of the carrier 381. In some embodiments, the tape 382 is made of silicon tape, thermal release tape, ultraviolet (UV) epoxy tape, or other suitable materials. In some embodiments, a first surface 382A and a second surface 382B of the tape 382 are adhesive, wherein the second surface 382B of the tape 382 is attached to the first surface 381A of the carrier 381, and the first surface 382A of the tape 382 faces away from the carrier 381.

A plurality of dies 301 are attached to the first surface 382A of the tape 382. In some embodiments, each of the dies 301 has a front surface 301F attached to the first surface 382A of the tape 382, and a back surface 301B facing away from the tape 382. In some embodiments, some of the dies 301 are arranged in an array, or arranged along one or more lines when viewed from above. In some embodiments, the dies are thinned prior to being attached to the tape 382. In some embodiments, some of the dies 301 are separated. In some embodiments, devices, active regions, or conductive features may be formed at a position proximal to the front surface 301F of the dies 301.

In some alternative embodiments, a substrate is attached to the first surface 382A of the tape 382, wherein the substrate is pre-treated with half-cut dicing to define positions of each dies (i.e. how each dies will be split subsequently), which facilitate the subsequent dicing operation. Alternatively stated, such substrate includes a plurality of dies 301, wherein some of the dies 301 may be temporarily connected.

A thermal management structure 1 is formed to cover the dies 301. The details of the thermal management structure 1 can be found by referring to discussions with respect to FIG. 1, wherein the thermal management structure 1 includes an adhesion layer 1*a*, a diffusion barrier layer 1*b* over the adhesion layer 1*a*, and a copper-phosphorous alloy layer 1*c* (which may include $Cu_3P$) over the diffusion barrier layer 1*b*. In some embodiments, the adhesion layer 1*a* is attached to the dies 301, and the copper-phosphorous alloy layer 1*c* is apart from the dies 301. The copper-phosphorous alloy layer 1*c* may be thermally coupled to a side surface of the dies 301. In some embodiments, a thickness of the copper-phosphorous alloy layer 1*c* may be less than 200 μm. In some embodiments, the thermal management structure 1 may also be formed in the gaps between the dies 301, wherein the adhesion layer 1*a* may be in direct contact with a sidewall of a die 301. In some embodiments, the copper-phosphorous alloy layer 1*c* is formed by electroless plating and electroplating operations, so that the quality of a coverage of the copper-phosphorous alloy layer 1*c* over the dies 301 can be improved. Further, the issues caused by the connections of thermal management structures 1 among the dies 301 can be avoided.

In some embodiments, a first photoresist layer (not separately shown) is deposited and patterned to form a mask layer over a dicing area (not separately shown) between the dies 301. When the thermal management structure 1 is deposited on the upper surfaces and sidewalls of the dies 301, portions of the first surface 382A of the tape 382 are covered by the first photoresist layer and thus not covered by the thermal management structure 1. The first photoresist layer may be removed or stripped after the completion of forming the thermal management structure 1.

A plurality of heat spreaders 3 are disposed above the thermal management structure 1. In some embodiments, the back surface 301B of each dies 301 is provided with one or more heat spreaders 3. In some embodiments, one die 301 corresponds to one heat spreader 3, wherein a width W3 of the heat spreader 3 is less than a width W301 of the die 301. In some embodiments, the heat spreaders 3 may include materials such as copper, foam copper, aluminum, thermal conductive metal, ceramic, $Al_2O_3$, AlN, or the like. In some embodiments, in order to improve the efficiency of thermal dissipation, a surface area of each heat spreader 3 can be designed to be greater than a surface area of a cube-shaped heat spreader with a similar volume. In some embodiments, the heat spreader 3 may have one or more surfaces with a corrugated profile. For example, each heat spreaders 3 may have a plurality of fin-type protrusions on one side or two sides (such as along Z direction). In some embodiments, the heat spreader 3 is referred to as a fin-type heat spreader 3 all over the outer surfaces. In some embodiments, the heat spreader 3 have a plurality of exposed gaps or holes to reduce the weight as well as increase the thermal dissipation area. In some embodiments, the heat spreader 3 may have a bottom in direct contact with the copper-phosphorous alloy layer 1*c* of the thermal management structure 1. Considering the aspect of thermal capacitance, the heat spreader 3 can provide a path for dissipating heat and alleviate the local overheating issue.

A copper-phosphorous alloy material layer 2M is formed to cover the exposed surfaces of the heat spreaders 3. In some embodiments, the copper-phosphorous alloy material layer 2M is made of $Cu_3P$. In some embodiments, the copper-phosphorous alloy material layer 2M further covers a portion of a first surface 1A of the thermal management structure 1 that was exposed by the heat spreaders 3. In some embodiments, the copper-phosphorous alloy material layer 2M covering a top, four sides, and a bottom of the heat spreaders 3. A thickness T2 of the copper-phosphorous alloy material layer 2M may be in a range from about 20 μm to about 200 μm. In some embodiments, the copper-phosphorous alloy material layer 2M is formed by applying both electroless plating and electroplating operations, wherein the dies 301, the carrier 381, the tape 382, the thermal management structure 1, and the heat spreaders 3 are disposed in a plating solution of system. The copper-phosphorous alloy material layer 2M provides excellent ability regarding dissipating heat, and further improves adhesion between the heat spreaders 3 and the copper-phosphorous alloy layer 1*c* of the thermal management structure 1 (not shown in FIG. 3, but can be found in FIG. 1). That is, the heat spreaders 3 may be tightly attached to the dies 301, and the reliability thereof is improved.

In some embodiments, a second photoresist layer (not separately shown) is deposited and patterned to form a mask layer over the dicing area between the dies 301. When the copper-phosphorous alloy material layer 2M is deposited on the upper surfaces and sidewalls of the heat spreaders 3, portions of the upper surface 382A of the tape 382 are covered by the second photoresist layer and thus not covered by the copper-phosphorous alloy material layer 2M. The second photoresist layer may be removed or stripped after the completion of forming the copper-phosphorous alloy material layer 2M of the thermal management structure 1. The harrow spaces of the dicing area between the dies 301 not occupied by the thermal management structure 1 or the copper-phosphorous alloy material layer 2M may lower the material thickness of the dicing area, and therefore the dicing operation can be performed more smoothly.

Figure 4:
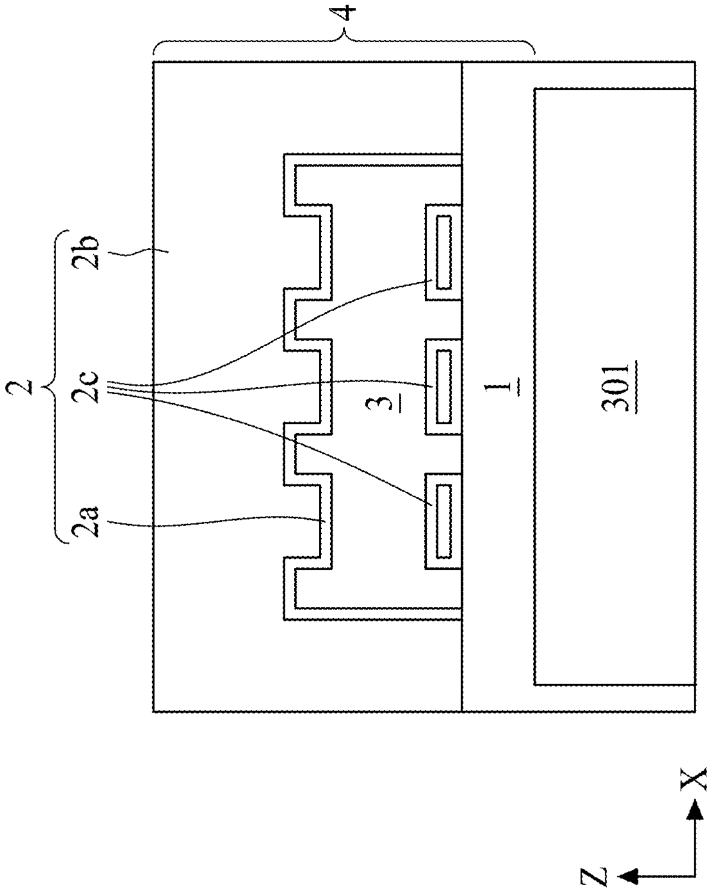

Referring to FIG. 3 and FIG. 4, FIG. 4 is a cross-sectional view of a semiconductor structure during intermediate stages of manufacturing operations, in accordance with some embodiments of the present disclosure. A dicing operation is performed to separate each dies 301 in predetermined fashion. In some embodiments, the dicing operation is performed by using a diamond cutter or laser. Note that a thickness T2 (shown in FIG. 3) of the copper-phosphorous alloy material layer 2M (or 2) (shown in FIG. 3) may be in a range from about 20 μm to about 200 μm. In some embodiments, the depth of the dicing operation may reach the front surface 381F of the die (shown in FIG. 3).

As shown in FIG. 3 and FIG. 4, after performing the dicing operation, the dies 301 can be separated from the tape 382, thereby obtaining a die 301, as well as the thermal management structure 1, the copper-phosphorous alloy material layer 2 (which is the portion of the copper-phosphorous alloy material layer 2M which is left after dicing), and one or more heat spreaders 3 attached to the die 301. Hereinafter the thermal management structure 1, the copper-phosphorous alloy material layer 2, and one or more heat spreaders 3 are collectively referred to as a thermal management auxiliary unit 4.

Herein, the copper-phosphorous alloy material layer 2 exhibits great ability of anti-corrosion, wear resistance, strength, and/or toughness. Therefore, the copper-phosphorous alloy material layer 2 can also serve as an anti-corrosion (or rustproof) protection layer. Thereby, it is possible to omit additional rustproof treatment on the heat spreaders 3, thereby reducing cost and improve throughput. Also, some of the conventional rustproof treatments may even lower the ability for heat spreaders 3 to dissipate heat. In addition, as previously discussed, the formation of the copper-phosphorous alloy material layer 2 is highly compatible with various types of materials of the heat spreaders 3, e.g., including but not limited to, copper, foam copper, aluminum, thermal conductive metal, ceramic, $Al_2O_3$, AlN.

In some alternative embodiments, the thermal management auxiliary unit 4 may further include a conductive layer 2*a*, a first copper-phosphorous alloy material layer 2*b* and a second copper-phosphorous alloy material layer 2*c*. The conductive layer 2*a* can be a silver layer or gold, coated in a conformal manner over the heat spreaders 3. That is, the conductive layer 2*a* is between the first copper-phosphorous alloy material layer 2*b* and the heat spreaders 3. In some embodiments, the conductive layer 2*a* covering a top, four sides, and a bottom of the heat spreader 3, and the first copper-phosphorous alloy material layer 2*b* covering a top and four sides of the conductive layer 2*a*. The silver (or gold) layer 2*a* can further enhance heat dissipation ability. Further, the first copper-phosphorous alloy material layer 2*b* can alleviate oxidation of the underlying conductive layer 2*a*, and further enhance the anti-corrosion ability of the thermal management auxiliary unit 4. The second copper-phosphorous alloy material layer 2*c* may be formed on the surfaces of gaps and holes at the bottom of heat spreader 3X. In some embodiments, the surfaces of gaps and holes at the bottom of heat spreader 3X are coated by the conductive layer 2*a* in a conformal way, and then covered by the second copper-phosphorous alloy material layer 2*c*.

In some alternative embodiments, the copper-phosphorous alloy layer 1*c* of the thermal management structure 1 can be substituted with an aluminum layer, which may be formed by a plating operation. The aluminum layer exhibits excellent ability for heat dissipation and has lower cost. In some embodiments, an anodizing operation may be performed to enhance anti-corrosion and rustproof ability of the aluminum layer.

The thermal management structure 1 can further be incorporated into a package structure, as will be discussed with reference to FIG. 5A.

Figure 5A:
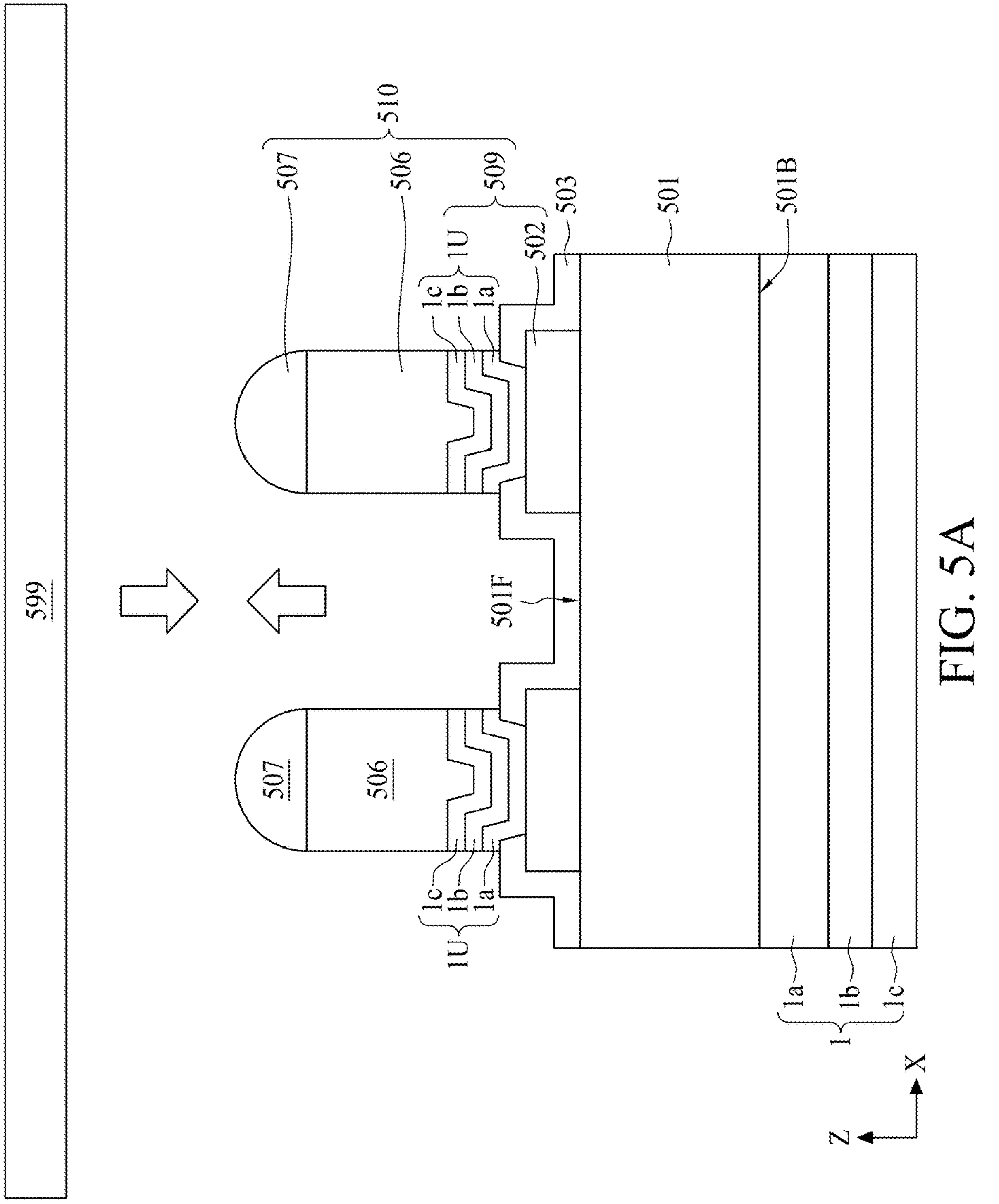
FIG. 5A is a cross-sectional view of a package structure during intermediate stages of manufacturing operations, in accordance with some embodiments of the present disclosure.

Referring to FIG. 5A, FIG. 5A is a cross-sectional view of a package structure by using copper pillar during intermediate stages of manufacturing operations, in accordance with some embodiments of the present disclosure. Compared with traditional solder bumps, the copper pillar technology provides greater control of the joint diameter and standoff height, enabling the creation of finer-pitch joints (20-40 μm), while solder bump technology reaches its pitch limit below about 125 μm. The copper pillar can provide a cylindrical joint between the bottom of the die and the top of the package substrate. Other benefits include improved electromigration resistance, thermal conductivity, thermal cycle reliability, simplified under-bump metallization (UBM), as well as higher I/O density. The copper pillar joints suffer less from these limitations, are an absolute must-have feature to enable the latest silicon process nodes of 28 nm and below, and also allow for smaller devices, as demanded by mobile device manufacturers, and reduce the number of package substrate layers, which lowers cost.

In FIG. 5A, a semiconductor substrate 501 (or in some embodiments, can be a semiconductor wafer or a silicon interposer is provided, wherein the substrate 501 includes a front surface 501F and a back surface 501B facing away from the front surface 501F. One or more conductive pads 502, which may serve as input/output (I/O) pads of the substrate 501, can be formed over the front surface 501F of the semiconductor substrate 501. In some of the embodiments, the semiconductor substrate 501 may be a silicon substrate. An insulation layer 503 is formed over the semiconductor substrate 501 and is subsequently selectively removed to expose at least a portion of the conductive pad 502. In some embodiments, the insulation layer 503 includes $SiO_2$. In embodiments where the semiconductor substrate 501 is a silicon interposer, the thickness of the semiconductor substrate 501 may be in a range from about 20 μm to about 50 μm.

A thermal management structure 1 over the back surface 501B of the substrate 501 and an under bump metallization (UBM) material layer (not shown, which will be patterned and become a UBM layer 1U) over the insulation layer 503 and the conductive pad 502, can be formed in a single operation. In some embodiments, a composition of the UBM material layer is similar to a composition of the thermal management structure 1. Specifically, the UBM material layer and the thermal management structure 1 may respectively have an adhesion layer 1*a*, a diffusion barrier layer 1*b* over the adhesion layer 1*a*, and a copper-phosphorous alloy layer 1*c* (which may include $Cu_3P$) over the diffusion barrier layer 1*b*. The adhesion layer 1*a* of the thermal management structure 1 is adjacent to the back surface 501B of the substrate 501, and the adhesion layer 1*a* of the UBM material layer is adjacent to the insulation layer 503 and the conductive pad 502. The copper-phosphorous alloy layer 1*c* of the thermal management structure 1 is apart from the back surface 501B of the substrate 501, and the copper-phosphorous alloy layer 1*c* of the UBM material layer is apart from the insulation layer 503 and the conductive pad 502. In some embodiments, a thickness of the adhesion layer 1*a* is in a range from about 0.5 μm to about 2.0 μm. In some embodiments, a thickness of the diffusion barrier layer 1*b* is in a range from about 0.1 μm to about 0.5 μm. In some embodiments, a thickness of the copper-phosphorous alloy layer 1*c* is in a range from about 1 μm to about 3 μm.

Specifically, the adhesion layer 1*a* is respectively formed over the back surface 501B of the substrate 501 as well as over the insulation layer 503 and the conductive pad 502 (which is over the front surface 501F of the substrate 501). The copper-phosphorous alloy layer 1*c* of the thermal management structure 1 and the copper-phosphorous alloy layer 1*c* of the UBM material layer can be formed in a single operation. In some of the embodiments, the adhesion layer 1*a* over the back surface 501B and the front surface 501F of the substrate 501 can be formed in a single operation. As previously discussed with reference to FIG. 2, the adhesion layer 1*a* is configured to alleviate the lattice mismatch issue caused by the underlying silicon surface, such as by eutectic bonding. Therefore, the adhesion layer 1*a* can enhance adhesion between the thermal management structure 1 and the back surface 501B of the substrate 501. Further, the adhesion layer 1*a* of the UBM material layer can improve the reliability of subsequent bonding operation due to its great adhesion force.

The adhesion layer 1*a* may include at least one of (a) conductive layer, e.g., a metal layer (such as Ag, Al, Au, et cetera) that has a lattice constant relatively closer to silicon, (b) a metal silicide layer (such as nickel silicide, cobalt silicide, palladium silicide, et cetera), or (c) a wetting layer (such as nickel seeding layer, or the like), wherein a lattice mismatch between nickel and silicon can be reduced to around 0.4%, and adhesion between nickel and silicon may be adequate.

In some embodiments, in the cases of the adhesion layer 1*a* including a nickel seeding layer, the nickel seeding layer may be formed by electroless plating operation, followed by an annealing operation. In some embodiments, the annealing operation may include using an excimer laser annealing operation (which may use laser gas, such as XeF, XeCl, KrF, KrCl, ArF, fluorine gas, or the like). Further, using electroless plating operation allows the adhesion layer 1*a* over the back surface 501B and the front surface 501F of the substrate 501 to be formed in a single operation.

The diffusion barrier layer 1*b* can be utilized to alleviate diffusion of copper in the conductive pillar 506 (the diameter and pitch are different for various applications, such as respectively 5 μm and 10 μm for DRAM) to the pad, and may be able to decrease internal stress. In some embodiments, the diffusion barrier layer 1*b* may include at least one of (a) a cobalt phosphorus (CoP) layer, which may be formed by techniques of electroless plating, (b) a nickel layer, which can be formed by electroless plating operation, or (c) a refractory metal layer, metal nitride derivatives or metal alloy (such as Ti, W, Mo, Ta, V, titanium tungsten, TiW nitride, $W_2N$, TiN, TaN, et cetera)). Specifically, cobalt phosphorus (CoP) layer exhibits greater step coverage compared to those materials that are formed by PVD operation, and exhibits great ability to hinder diffusion. On the other hands, a refractory metal layer, metal nitride derivatives or metal alloy (such as Ti, W, Mo, Ta, V, titanium tungsten, TiW nitride, $W_2N$, TiN, TaN, et cetera) exhibit greater thermal conductivity while hindering diffusion under an elevated temperature. In some embodiments, in the cases of using a cobalt phosphorus (CoP) layer or a nickel layer as a material of the diffusion barrier layer 1*b* for the thermal management structure 1 as well as the UBM material layer, both of the diffusion barrier layer 1*b* of the thermal management structure 1 and the diffusion barrier layer 1*b* of the UBM material layer can be formed in a single operation by the electroless plating operation.

The copper-phosphorous alloy layer 1*c* exhibits greater thermal conductivity compared to conventional thermal dissipation plates and conventional thermal interface materials, and has a more condensed structure, and can improve anti-corrosion, wear resistance, wettability, strength, toughness, conformability, processability, et cetera.

In some embodiments, the copper-phosphorous alloy layer 1*c* may be formed by performing an electroless plating operation. Particularly, by using the electroless plating operation, the copper-phosphorous alloy layer 1*c* of the thermal management structure 1 (which is over the back surface 501B of the substrate 501) and the copper-phosphorous alloy layer 1*c* of the UBM material layer (which is over the front surface 501F of the substrate 501) can be formed in a single operation since the entire substrate 501 can be soaked in the plating solution.

Further, a conductive pillar 506 is formed over the UBM material layer, and an alloy layer 507 is subsequently formed over the conductive pillar 506. For example, a photoresist layer (or a dry film, not shown) is formed over the UBM material layer, and a photolithography operation utilizing a patterned mask (not shown) can be performed. The conductive pillar 506 may be formed of a conductive material, e.g., copper, and the alloy layer 507 may be referred to as a soldering material for bonding. A plurality of recesses corresponding to the conductive pads 502 are defined by the photoresist layer, and at least a portion of the UBM material layer is thereby exposed through the photoresist layer. In some embodiments, a protection layer (such as a photoresist layer or a dry film) may be formed over the copper-phosphorous alloy layer 1*c* of the thermal management structure 1. Also, the conductive pillar 506 may be formed in the recesses, wherein the conductive pillar 506 may be in direct contact with the copper-phosphorous alloy layer 1*c* of the UBM material layer. In some embodiments, the conductive pillar 506 can be formed by an electroplating operation, which may have improved efficiency as previously discussed. Further, the protection layer can protect the thermal management structure 1 during the electroplating operation. In some embodiments, a thickness of the conductive pillar 506 may be in a range from about 8 μm to about 10 μm.

In some embodiments, the solder alloy layer 507 may include Sn—Ag alloy such as Sn, Ag, Cu, and Sb (such as 96.3% Sn, 3% Ag, 0.5% Cu, and 0.2% Sb). In some alternative embodiments, the solder alloy layer 507 may include Sn, Ag, Bi, and Cu (such as 93.3% Sn, 3.1% Ag, 3.1% Bi, and 0.5% Cu). In some embodiments, a thickness of the solder alloy layer 507 may be in a range from about 10 μm to about 15 μm. In some embodiments, the solder alloy layer 507 can be utilized as a conductive bump for a subsequent bonding operation. The photoresist protection layer is removed by performing a lift-off operation after the solder alloy layer 507 is formed, thereby a sidewall of the conductive pillar 506 as well as a sidewall of the solder alloy layer 507 may be exposed.

In addition, a portion of the UBM material layer that is not under a coverage of the conductive pillar 506 is removed, thereby exposing an underlying portion of the insulation layer 503 and forming a UBM layer 1U (which is a patterned version of the UBM material layer). In some embodiments, the removal operation may include a reactive ion etching (RIE) operation, or other suitable removal operations. Thereby, the remaining UBM layer 1U and the conductive pad 502 can be collectively referred as a conductive pad, a contact pad, or an input/output (I/O) pad 509. Alternatively stated, the conductive pad 509 includes the copper-phosphorous alloy (such as $Cu_3P$). During the formation of UBM layer 1U, it is not required to create a vacuum environment, which is expensive and may face the challenge of lower throughput. The patterned mask layer may be removed from the front surface of the substrate 501 after the UBM layer 1U and the thermal management structure 1 are formed. The patterning of the UBM material layer for forming the UBM layer can be performed before the formation of the conductive pad 502 and the conductive pad 509, or can be performed after the pattering operation of the conductive pad 502 and the conductive pad 509.

A reflow operation can be performed to form a pillar that includes a copper-based alloy and a Sn—Ag alloy. The semiconductor substrate 501 can be bonded to a carrier 599 (such as an IC board or a substrate), thereby forming a package. In some embodiments, the conductive pad 509 including a copper-phosphorous alloy as discussed with reference to the present disclosure can be applied to other multilayer wiring structures, such as a wafer substrate, a PCB, an interposer, an IC carrier, a redistribution layer, a core substrate, a coreless substrate, a ceramic substrate, or the like. Such configuration may improve the reliability of electrical connection and the properties thereof.

Figure 5B:
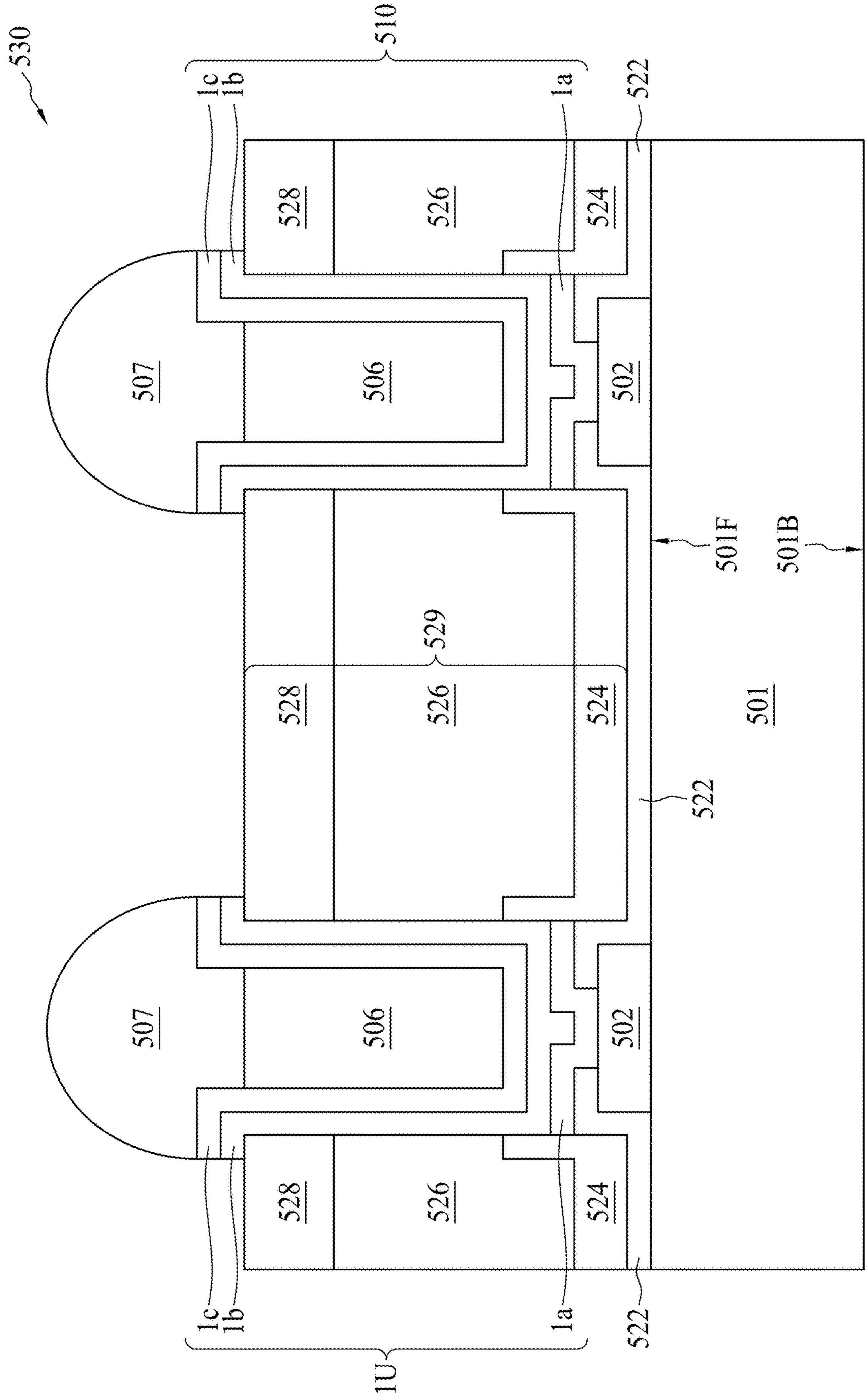
FIG. 5B is a cross-sectional view of a package structure, in accordance with some embodiments of the present disclosure.

FIG. 5B is a cross-sectional view of a package structure 530, in accordance with some embodiments of the present disclosure. The package structure 530 may be similar to the package structure shown in FIG. 5A, and details of these similar features will not be repeated for the sake of brevity. Referring to FIG. 5B, a substrate 501 is provided. Subsequently, one or more conductive pads 502 are deposited and patterned over the front surface 501F of the substrate 501. An insulating layer 522 is formed over the front surface 501F and the conductive pads 502. The insulating layer 522 may be formed of a dielectric material, e.g., silicon oxide. The insulating layer 522 is patterned to remove portions of the insulating layer 522 from the upper surface of the conductive pads 502 such that a central portion of each of the conductive pads 502 is exposed.

An adhesion layer 1*a* of the UBM layer 1U is formed and patterned over the conductive pads 502. The patterned adhesion layer 1*a* may have sidewalls flushed with sidewalls of the insulating layer 522. The pattering of the adhesion layer 1*a* may include lithography and etching operations associated with a lift-off process using a lift-off photoresist layer. A first layer 524, a second layer 526, and a third layer 528 of dielectrics are subsequently deposited over the adhesion layer 1*a* and the insulating layer 522 to form a tri-layer antireflective structure 529. The tri-layer antireflective structure 529 may be formed of several dielectric layers to form a dielectric layer stack. According to some embodiments, the first layer 524 and the third layer 528 of the tri-layer antireflective structure 529 include silicon nitride, silicon oxynitride, or the like, and are deposited using a low-temperature deposition method or a spin-on coating method. According to some embodiments, the second layer 526 of the tri-layer antireflective structure 529 includes silicon oxide, or the like, and is deposited using a low-temperature deposition method or a spin-on coating method. The first layer 524 may be deposited over the insulating layer 522 and the upper surface of the adhesion layer 1*a* in a conformal manner, while the second layer 526 and the third layer 528 may be deposited over the first layer 524 in a blanket manner.

One or more vias (not separately shown) are formed through the tri-layer antireflective structure 529 to expose the adhesion layers 1*a*. According to some embodiments, a photoresist layer (not separately shown) is deposited in a blanket manner over the tri-layer antireflective structure 529. Photolithography and etching operations are performed to etch the vias through the layers 528, 526 and 524 until the upper surfaces of the adhesion layers 1*a* are exposed. The sidewalls of the layers 524, 526, 528 may define the sidewalls of the vias over the adhesion layers 1*a*.

A diffusion barrier layer 1*b* and a copper-phosphorous alloy layer 1*c* of the UBM layer 1U are subsequently deposited over the adhesion layer 1*a* and the upper surface of the photoresist layer over the tri-layer antireflective structure 529. Further, a conductive material for forming the conductive pillar 506 is deposited in the vias over the UBM layer 1U. A conductive material for forming the solder alloy layer 507 is deposited over the conductive material of the conductive pillar 506. According to some embodiments, the deposition operation for the conductive pillar 506 can be repeated several times to increase the deposited height of the conductive pillars 506 according to different requirements.

A lift-off operation is performed on the photoresist layer to remove the photoresist layer from the tri-layer antireflective structure 529. The excess materials of the conductive materials for forming the conductive pillar 506 and the solder alloy layer 507 over the tri-layer antireflective structure 529 are also removed together with the removal of the photoresist layer. As a result, an upper surface of the third layer 528 is exposed. A reflow operation is performed on the material of the solder alloy layer 507 to form the solder alloy layer 507 with a spherical or semi-spherical shape.

According to some embodiments, the conductive pillars 506 can be formed to through the substrate 501 via a through-substrate via (TSV) structure, in which the substrate 501 is generally formed of bulk silicon. In that case, the substrate 501 may be thinned, and through vias are formed through the substrate 501, followed by the deposition of the tri-layer antireflective structure 529 and electroplating copper in the through vias. The remaining operations for forming the UBM layer 1U, and the conductive pillars 506 are similar to the embodiment described earlier with respect to the package structure 530.

The package structure 530 provides advantages. Since the spaces between the adjacent conductive pillars 506 and the solder alloy layer 507 are filled with the tri-layer antireflective structure 529, external particles, moisture, water or dust may not fall into the gaps between the conductive pillars 506. As a result, the electrical insulation performance and the reliability of the conductive pillars 506 can be maintained.

Figure 5C:
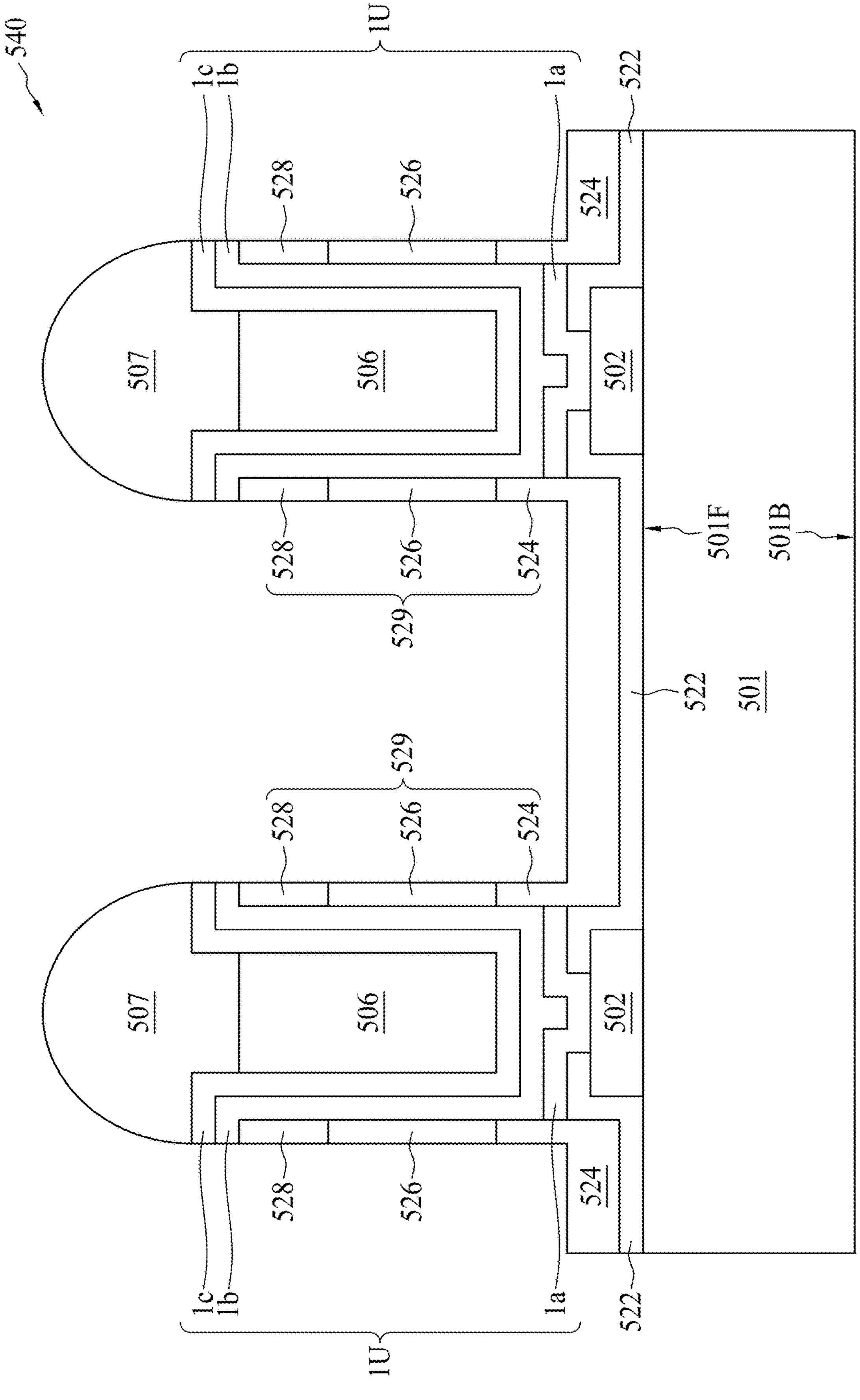
FIG. 5C is a cross-sectional view of a package structure, in accordance with some embodiments of the present disclosure.

FIG. 5C is a cross-sectional view of a package structure 540, in accordance with some embodiments of the present disclosure. The package structure 540 is similar to the package structure 530 in many aspects, and these similar features would not be repeated for the sake of brevity. Referring to FIG. 5B and FIG. 5C, the difference between the package structure 540 and the package structure 530 lies in that a majority of the tri-layer antireflective structure 529 between the adjacent conductive pillars 506 are removed. Only a thin potion of the tri-layer antireflective structure 529 is left on the sidewalls of the diffusion barrier layer 1*b*. According to some embodiments, a horizontal portion of the first layer 524 is kept over the insulating layer 522 to protect and encapsulate the underlying insulating layer 522.

Figure 5D:
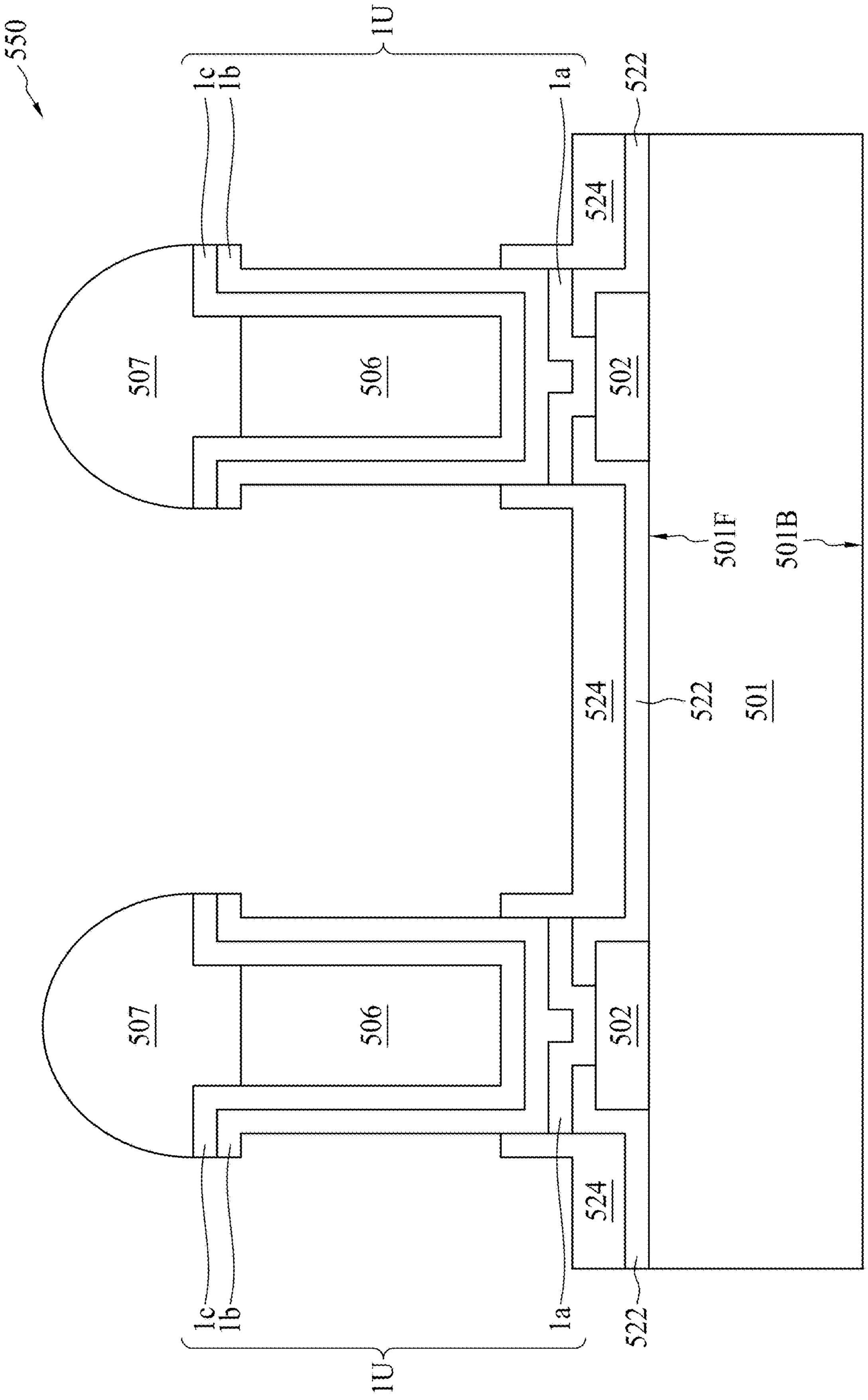
FIG. 5D is a cross-sectional view of a package structure, in accordance with some embodiments of the present disclosure.

FIG. 5D is a cross-sectional view of a package structure 550, in accordance with some embodiments of the present disclosure. The package structure 550 is similar to the package structure 530 or 540 in many aspects, and these similar features would not be repeated for the sake of brevity. Referring to FIG. 5C and FIG. 5D, the difference between the package structure 550 and the package structure 540 lies in that an entirety of the second layer 526 and the third layer 528 of the tri-layer antireflective structure 529 between the adjacent conductive pillars 506 is removed. The first layer 524 of the tri-layer antireflective structure 529 remains on the sidewalls of the diffusion barrier layer 1*b*, the adhesion layer 1*a*, and the insulating layer 522 and over the horizontal portion of the insulating layer 522. The space between the adjacent conductive pillars 506 is filled by air only, and therefore the diffusion barrier layers 1*b* of adjacent conductive pillars 506 face each other.

Referring to FIG. 5A, the adhesion layer 1*a*, the diffusion barrier layer 1*b* and the copper-phosphorous alloy layer 1*c* of the thermal management structure 1 can be deposited respectively at the same time when the adhesion layer 1*a*, the diffusion barrier layer 1*b* and the copper-phosphorous alloy layer 1*c* of the UBM layer 1U are formed. According to some embodiments, the adhesion layers 1*a* of the thermal management structure 1 and the UBM layer can be formed using a single deposition process, the diffusion barrier layers 1*b* of the thermal management structure 1 and the UBM layer can be formed using a single deposition process, and the copper-phosphorous alloy layers 1*c* of the thermal management structure 1 and the UBM layer can be formed using a single deposition process. Referring to FIGS. 5B to 5D, although not separately illustrated, the thermal management structure 1 can be also formed on the back side 501B of the substrates 501 of the package structure 530, 540 or 550. Similarly, the adhesion layer 1*a*, the diffusion barrier layer 1*b* and the copper-phosphorous alloy layer 1*c* of the thermal management structure 1 of the package structure 530, 540 or 550 can be respectively deposited at the same time when the adhesion layer 1*a*, the diffusion barrier layer 1*b* and the copper-phosphorous alloy layer 1*c* of the UBM layer 1U of the package structure 530, 540 or 550 are formed. According to some embodiments, the adhesion layers 1*a* of the thermal management structure 1 and the UBM layer of the package structure 530, 540 or 550 can be formed using a single deposition process, the diffusion barrier layers 1*b* of the thermal management structure 1 and the UBM layer of the package structure 530, 540 or 550 can be formed using a single deposition process, and the copper-phosphorous alloy layers 1*c* of the thermal management structure 1 and the UBM layer of the package structure 530, 540 or 550 can be formed using a single deposition process.

Embodiment(s) of a package structure provided with the thermal management structures, which includes an interfacial layer 6 and a copper-phosphorous alloy layer 7, will be subsequently discussed with reference to FIG. 6.

Figure 6:
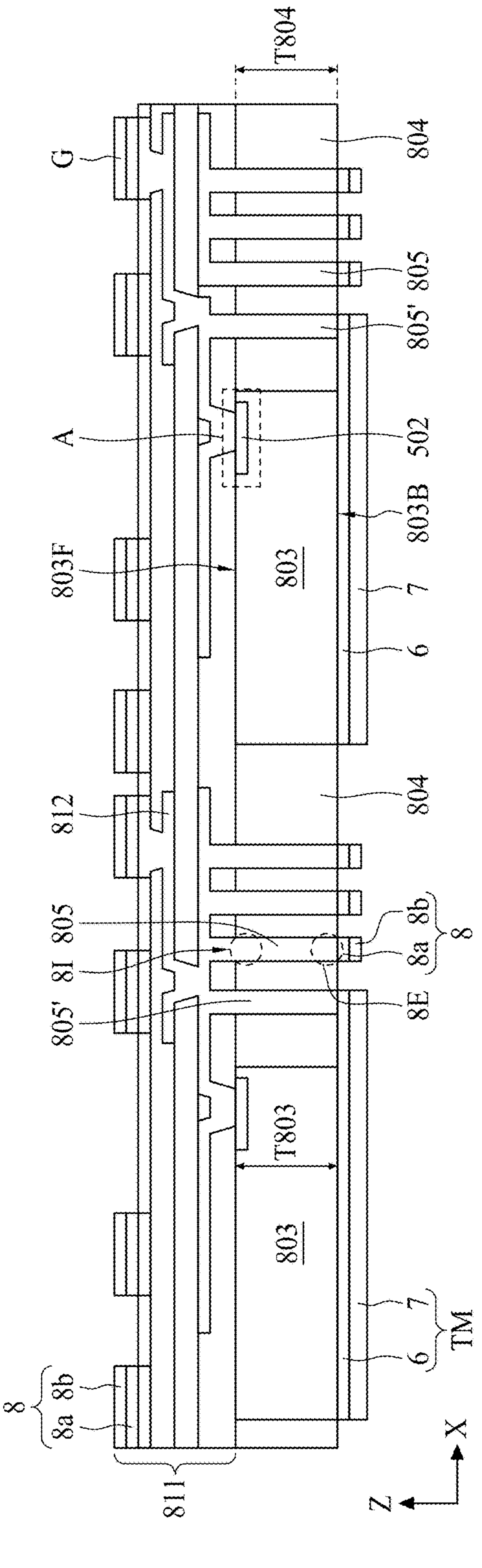
FIG. 6 is a cross-sectional view of a package structure, in accordance with some embodiments of the present disclosure.

Referring to FIG. 6, FIG. 6 is a cross-sectional view of a package structure (such as Fan-Out Wafer Level Package, FOWLP), in accordance with some embodiments of the present disclosure. There are two fan-out structures/processes, the first one is chip-first: the chips are first embedded in a temporary (carrier or panel) or permanent material structure, followed by the RDL (Redistribution Layer) forming processes. The second is chip-last (also known as RDL first): the chips are not integrated into the packaging processes until the RDL on the carrier or panel are pre-formed. In the following embodiments either the first one (with some interposing layers of ABF or BT) is modified or the second one (such as ceramic interposer) are applied. In some embodiments, each of the dies 803 has a front surface 803F, which has a conductive pattern, and a back surface 803B opposite to the front surface 803F. In some of the embodiments, the dies 803 are thinned prior to being attached to the tape. In some embodiments, the dies 803 are known good dies (KGD). In some embodiments, the dies 803 are fan-out type semiconductor dies. Referring to FIG. 5A and FIG. 6, the UBM layer 1U of the bumping structure 510 disposed over the front surface 803F of the dies 803 is in contact with the input/output (I/O) pad (or contact pad) 502 on the front surface of the dies 803. Referring to FIG. 6, the substrate 501 may be diced to generate a plurality of dies 803. A plurality of dies 803 are disposed with its back surface 803B adhered on a tape or panel (such as a silicon tape, a thermal release tape, an ultraviolet (UV) epoxy tape, or other suitable materials) and/or a carrier (not shown)), wherein each of the dies 803 are apart from each other with a pitch, thus a fan-out interposer with fan-out region RO between two dies 803 can be formed for complying with a fan-out device's specification. An encapsulant or molding compound 804 is formed only at the fan-out region RO to encapsulate, e.g., laterally surround, the dies 803. The molding compound 804 may further be formed in the gaps between the dies 803. The molding compound 804 may encapsulate at least one side surface of the dies 803. In some embodiments, a thickness T804 of the molding compound 804 in the fan-out region RO is similar to a thickness T803 of the dies 803. In some embodiments, a difference between the thickness T804 and the thickness T803 is in a range from about 2 μm to about 5 μm. In some embodiments, the molding compound 804 is made of epoxy molding compound (EMC), polyimide (PI), or other suitable materials such as plastic or polymer materials. In some embodiments, the molding compound 804 may be formed by molding techniques (such as injection molding), 3D printing, additive manufacturing, or the like. In some embodiments, a plurality of recesses are formed in the molding compound 804 at the fan-out region RO of redistribution layer (RDL) 811, thereby allowing the subsequent formation of conductive vias 805 (the diameter and pitch are different for various applications, such as respectively 5 μm and 10 μm for DRAM), which may be formed as through vias, in the molding compound 804. Alternatively stated, the conductive vias 805 are laterally surrounded by the molding compound 804.

Referring to FIG. 5 and FIG. 6 and following the fabrication process of FOWLP, some vias are formed either on the input/output (I/O) pad 502 (or contact pad) or in the molding compound 804, and then electroplating copper to fill the vias on both of them and also forming the interposing conductive features 812. Finally, a conductive pillar 8*a* and an alloy (tin-silver (Sn—Ag)) layer 8*b* are formed on the interposer 811. In some embodiments, a protection layer (not shown, which can be a photoresist, dry film, a tape, a mask or a sacrificial layer) is formed over the RDL 811 during the formation of 8*a* and 8*b*.

In some embodiments, the conductive vias 805 are made of copper and can be formed by an electroplating operation.

A redistribution layer (RDL) 811 of fan-out interposer FO is formed on the front surface 803F of the dies 803 with a bumping structure (not shown) on the pad 502 (portion A shown in FIG. 6), and the pads 502 of the die are fanned out by the interposer 811. The bumping structure on the pad 502 of FIG. 6 may correspond to a bumping structure 510 of FIG. 5A or FIG. 5B, in which the bumping structure 510 includes the conductive pad 509, the conductive pillar 506 and the alloy layer 507. In some embodiments, the bonding operation is discussed with reference to FIG. 5 of the present disclosure, or, FIG. 5A to FIG. 5D of U.S. non-provisional application Ser. No. 17/697,937, which is hereby incorporated by reference. The RDL 811 includes a plurality of conductive features 812 facing away from the dies 803. Then the module M1 formed by the dies 803, the molding compound 804, the conductive vias 805 formed in the molding compound 804 and the redistribution layer (RDL) 811 can be separated from the tape. Next, the module M1 is flipped and disposed on another tape for the next fabrication step as follows.

An interfacial layer 6 and the copper-phosphorous alloy layer 7 are formed over the back surface 803B of each dies 803. In some embodiments, the interfacial layer 6 includes an adhesion layer and a diffusion barrier layer, which can correspond to the adhesion layer 1*a* and the diffusion barrier layer 1*b* discussed with reference to FIG. 1 or FIG. 5A. In some embodiments, a copper-phosphorous alloy layer 7 (which may be made of $Cu_3P$) is formed over each interfacial layer 6 by an electroless plating operation with thickness less than 1 μm. In addition, the copper-phosphorous alloy layer 7 can also be formed by an electroplating operation with a thickness less than 200 μm to obtain a denser structure, and a thicker layer with improve efficiency. In the present disclosure (including other embodiments that applies), the interfacial layer 6 and the copper-phosphorous alloy layer 7 are collectively referred to as a thermal management structure TM thermally coupled to the back surface 803B of the dies 803. In some embodiments, both the interfacial layer 6 and the copper-phosphorous alloy layer 7 may further extend to locations over a portion of the molding compound 804 and some of the conductive vias 805 formed in the molding compound 804. In some embodiments, a protection layer (not shown, which can be a photoresist, dry film, a tape, a mask or a sacrificial layer) is formed over the RDL 811 during the formation of interfacial layer 6 and the copper-phosphorous alloy layer 7 in order to avoid pollution.

In some embodiments, a subset of the conductive vias 805 that are covered by the interfacial layer 6 and the copper-phosphorous alloy layer 7 may be hereinafter referred to as ball grid array grounding vias or grounding through vias 805' in some of the applications. The grounding through vias 805' may be arranged adjacent to the remaining ones of the through vias 805 not covered by the interfacial layer 6. The grounding through vias 805' are electrically connected through the conductive features 812 to the thermal management structure of the bumping structure 510 on the pad 502 over the front surface 803F of the dies 803. In some embodiments, the bumping structure 510 on the pad 502 is connected to the system ground point G and configured to ground the die 803. Sometimes, the combination of the conductive grounding features 812, the grounding through vias 805' and the bumping structure on the pad 502 can increase the thermal dissipation efficiency over the one to apply only the thermal management structure TM by 30-40%. These new ideals are the key points of this invention.

Pillars 8 are formed over a plurality of the conductive vias 805 that are exposed by the interfacial layer 6 and the copper-phosphorous alloy layer 7. Further, the pillars 8 are formed over the plurality of conductive features 812 that are facing away from the dies 803. In some embodiments, the pillar 8 is a multilayer structure, for example, the pillar 8 includes a conductive pillar 8*a* and an alloy (tin-silver (Sn—Ag)) layer 8*b* over the conductive pillar 8*a*. In some embodiments, the conductive pillar 8*a* is formed of a conductive material, e.g., copper, and the alloy layer 8*b* serves as a soldering material of the pillar 8 for bonding. In some embodiments, the conductive pillar 8*a* and the alloy layer 8*b* can be formed by an electroplating operation. In some embodiments, a photoresist layer (not shown) can be formed over predetermined areas prior to performing electroplating operation(s) to form the pillar 8, wherein the photoresist layer (or the dry film) can be subsequently removed. In some embodiments, the pillars 8 are adapted to be bonded to another die (not shown) or other suitable devices to make a stack-type connection. The cost by using this kind of FOWLP is much less than using TSV interposer.

In some embodiments, an external end 8E of the conductive vias 805 is leveled with an end of the through via 805' in connection to the thermal management structure of bumping structure. The external end 8E of the conductive vias 805 is in connection to the alloy layer 8*b* of the pillars 8 through the conductive pillar 8*a*. In some embodiments, an internal end 8I of the conductive vias 805 is in connection to the RDL 811 over the front surface 803F of the dies 803. Then the first module of FOWLP in FIG. 6 is well-done and ready to combine with other packages.

Embodiment(s) of a package structure provided with thermal dissipation layer(s) will be subsequently discussed with reference to FIG. 7A to FIG. 7F. Specifically, FIG. 7A, FIG. 7B and FIG. 7C show a method for forming a first die provided with a thermal management structure, FIG. 7E shows a method for forming a second die provided with a thermal management structure, and FIG. 7F shows a method for bonding the first die to the second die.

Figure 7A:
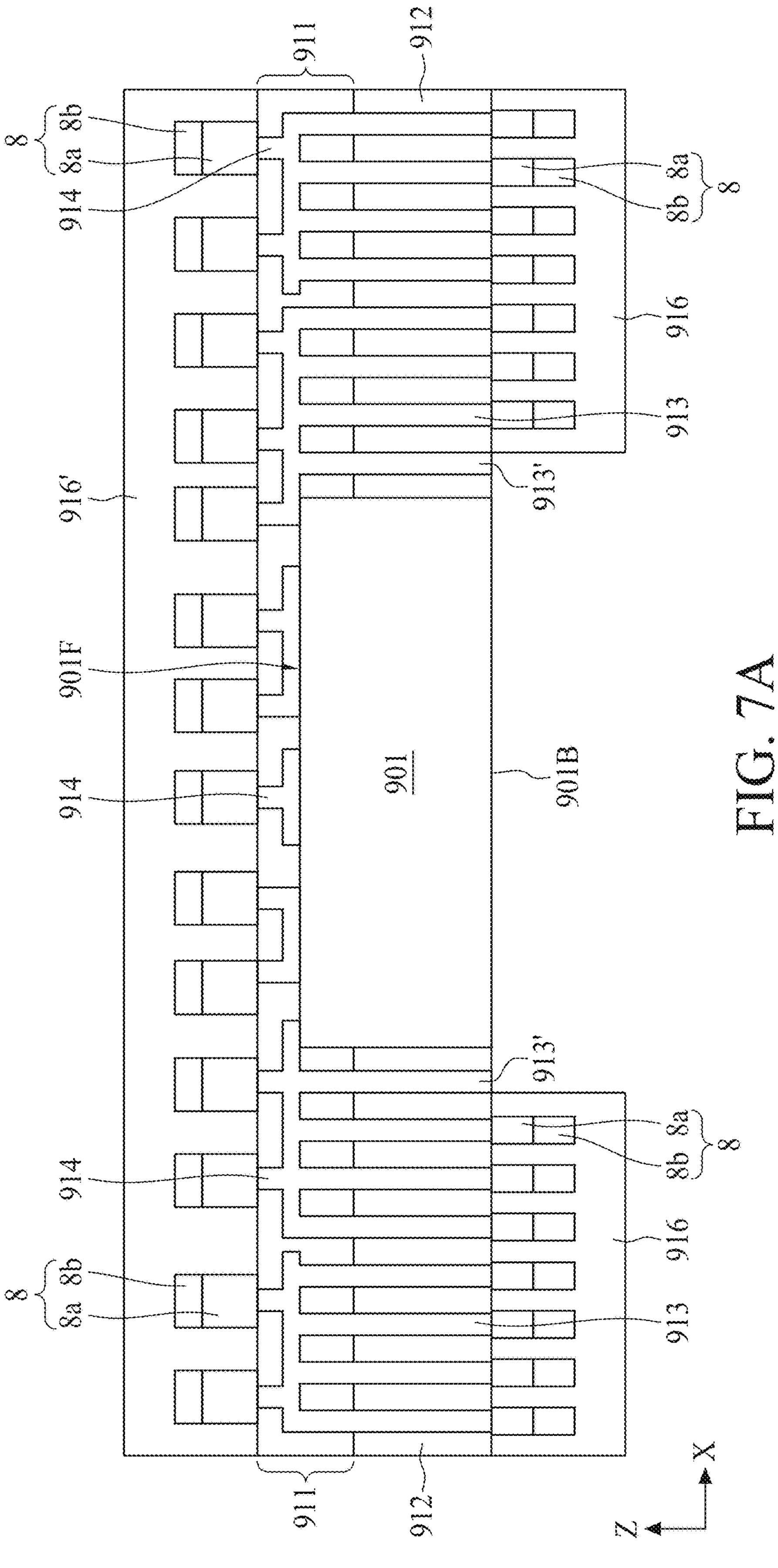
FIG. 7A and FIG. 7B are cross-sectional views of a semiconductor structure during intermediate stages of manufacturing operations, in accordance with some embodiments of the present disclosure.
Figure 7B:
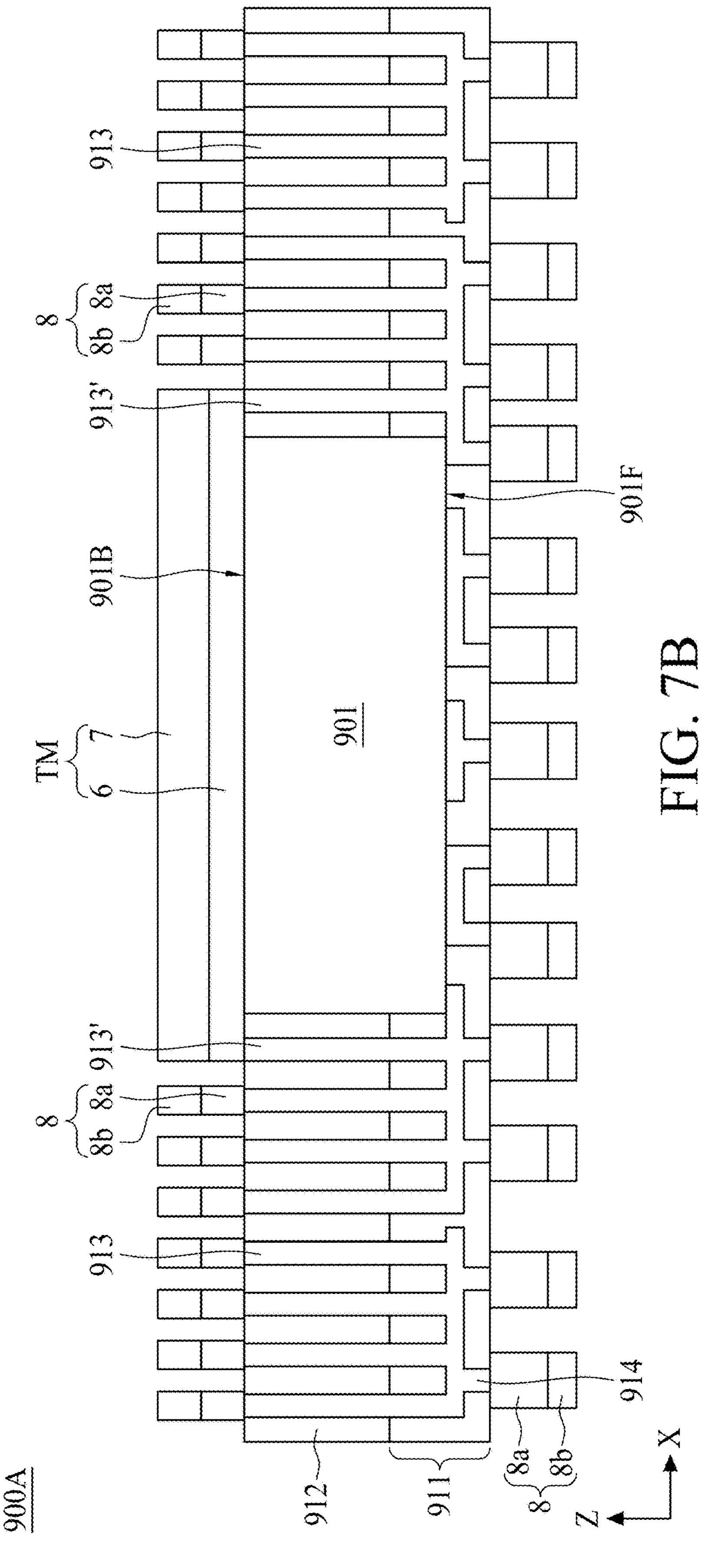
Figure 7C:
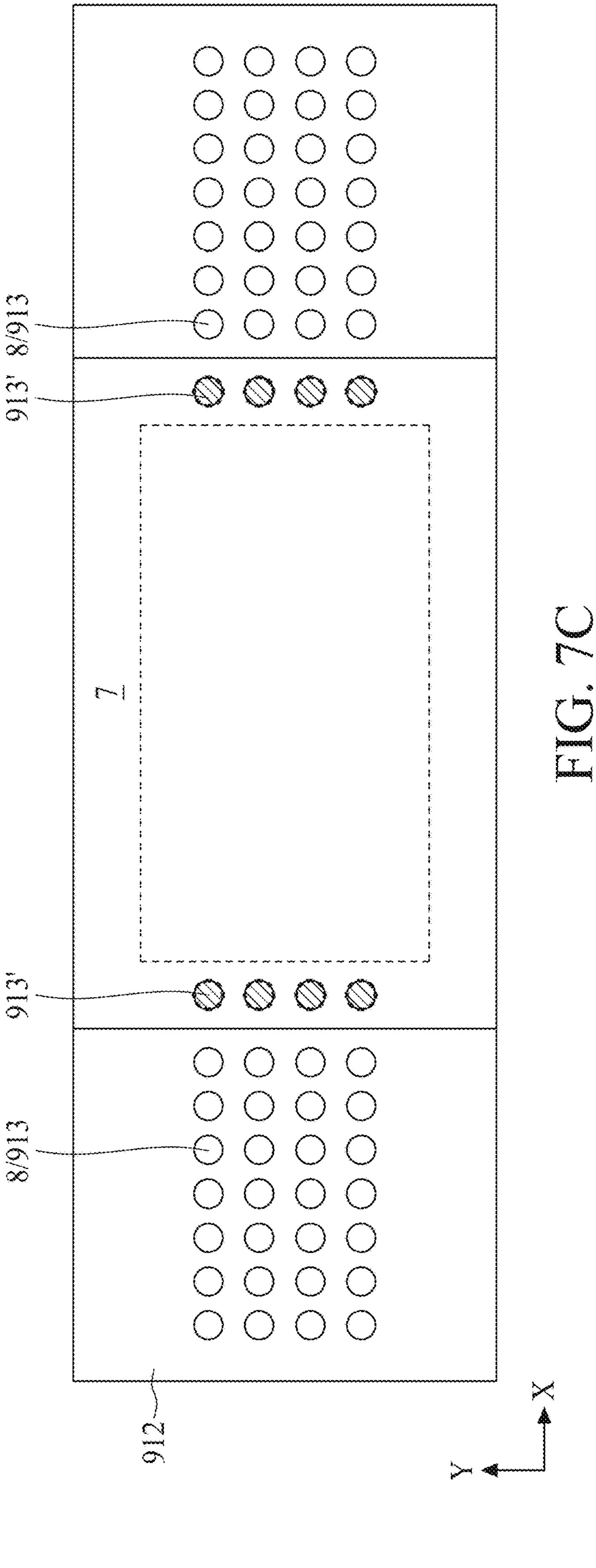
FIG. 7C is a top view of the semiconductor structure of FIG. 7B during intermediate stages of manufacturing operations, in accordance with some embodiments of the present disclosure.

Referring to FIG. 7A, FIG. 7B is a cross-sectional view of a semiconductor structure during intermediate stages of manufacturing operations, in accordance with some embodiments of the present disclosure. Referring to FIG. 7A and follow the first fabrication process of FOWLP, a plurality layers of ABF (or BT) of the fan-out interposer FO (with redistribution lines (RDLs) 911) are formed over the front surface 803F of the first die 901, and some vias are formed on the input/output (I/O) pad (or contact pad) 502, and then the UBM layer 1U of the bumping structure 510 disposed over the front surface 901F of the die 901 is in contact with the input/output (I/O) pad (or contact pad) 502 on the front surface of the die 901. A fan-out region RO (e.g. made by layers of ABF (preferred) or BT) and an encapsulant or molding compound 912 is formed on to at least partially surround a first die 901 laterally, wherein the first die 901 has a front surface 901F and a back surface 901B opposite to the front surface 901F. In some embodiments, the molding compound 912 is made of epoxy molding compound (EMC), polyimide (PI), or other suitable materials such as plastic or polymer materials. The molding compound 912 may encapsulate at least one side surface of the dies 901. In some embodiments, the molding compound 912 may be formed by molding techniques (such as injection molding), 3D printing, additive manufacturing, or the like. A plurality of the conductive vias 913 are configured in the molding compound 912 and laterally surrounded by the molding compound 912. In some embodiments, a plurality of grounding vias or through vias 913' are formed at positions proximal to the first die 901 to reduce grounding-loop area and parasitic effects. In some embodiments, the through vias 913' are configured to ground the first die 901. The grounding vias 913' may be configured to electrically connect the front surface 901F of the first die 901 and the thermal management structure TM over the back surface 901B of the first die 901. Conductive features 914 on the RDL 911 may be electrically connected to some of the conductive vias 913 and/or the grounding vias 913'. Thus, a RDL 911 of the fan-out interposer RO is completely formed, and the front surface 901F of the first die 901 with a UBM layer 1U of the bumping structure on the pad 502 (not shown) are fanned out by the fan-out interposer FO.

A plurality of pillars 8 are formed respectively over the plurality of the conductive vias 913 and a plurality of conductive features 914 of the RDL 911. In some embodiments, the pillar 8 is a multilayer structure, for example, the pillar 8 includes a conductive pillar 8*a* (copper) and an alloy layer 8*b* (tin-silver (Sn—Ag)) over the conductive pillar 8*a*. In some embodiments, the conductive pillar 8*a* and the alloy layer 8*b* can be formed by an electroless plating operation.

Note that during the fabrication of the device the following operations may be applied. A first photoresist layer 916 (or dry film) is patterned over the molding compound 912 to cover the pillars 8 over the molding compound 912. In some embodiments, the plurality of grounding vias 913' and the back surface 901B of the first die 901 are exposed from the first photoresist layer 916. A second photoresist layer 916' is formed over the RDL 911 to cover the pillars 8 over the RDL 911. In some embodiments, the sidewalls of each pillars 8 are covered by the first photoresist layer 916 or the second photoresist layer 916'. In some alternative embodiments, the second photoresist layer 916' can be substituted by other sacrificial layers or adhesion tapes.

Referring to FIG. 7B and FIG. 7C, FIG. 7B is a cross-sectional view of a semiconductor structure during intermediate stages of manufacturing operations, and FIG. 7C is a top view of the semiconductor structure of FIG. 7B during intermediate stages of manufacturing operations, in accordance with some embodiments of the present disclosure. An interfacial layer 6 is formed over the back surface 901B of the first die 901 and the grounding vias 913'. In some embodiments, the interfacial layer 6 includes an adhesion layer and a diffusion barrier layer, which can correspond to the adhesion layer 1*a* and the diffusion barrier layer 1*b* discussed with reference to FIG. 1 or FIG. 5A. In some embodiments, a copper-phosphorous alloy layer 7 (which may be made of $Cu_3P$) is formed over each interfacial layer 6, thereby forming a thermal management structure TM thermally coupled to the back surface 901B of the dies 901. In some embodiments, the interfacial layer 6 and the copper-phosphorous alloy layer 7 may be formed by an electroless plating operation, while the pillars 8 are protected by the first photoresist layer 916 (or dry film) or the second photoresist layer 916' (shown in FIG. 7A) during the electroless plating operation. After forming the interfacial layer 6 and the copper-phosphorous alloy layer 7, the first photoresist layer 916 and the second photoresist layer 916' are removed, thereby forming a first structure 900A.

Figure 7D:
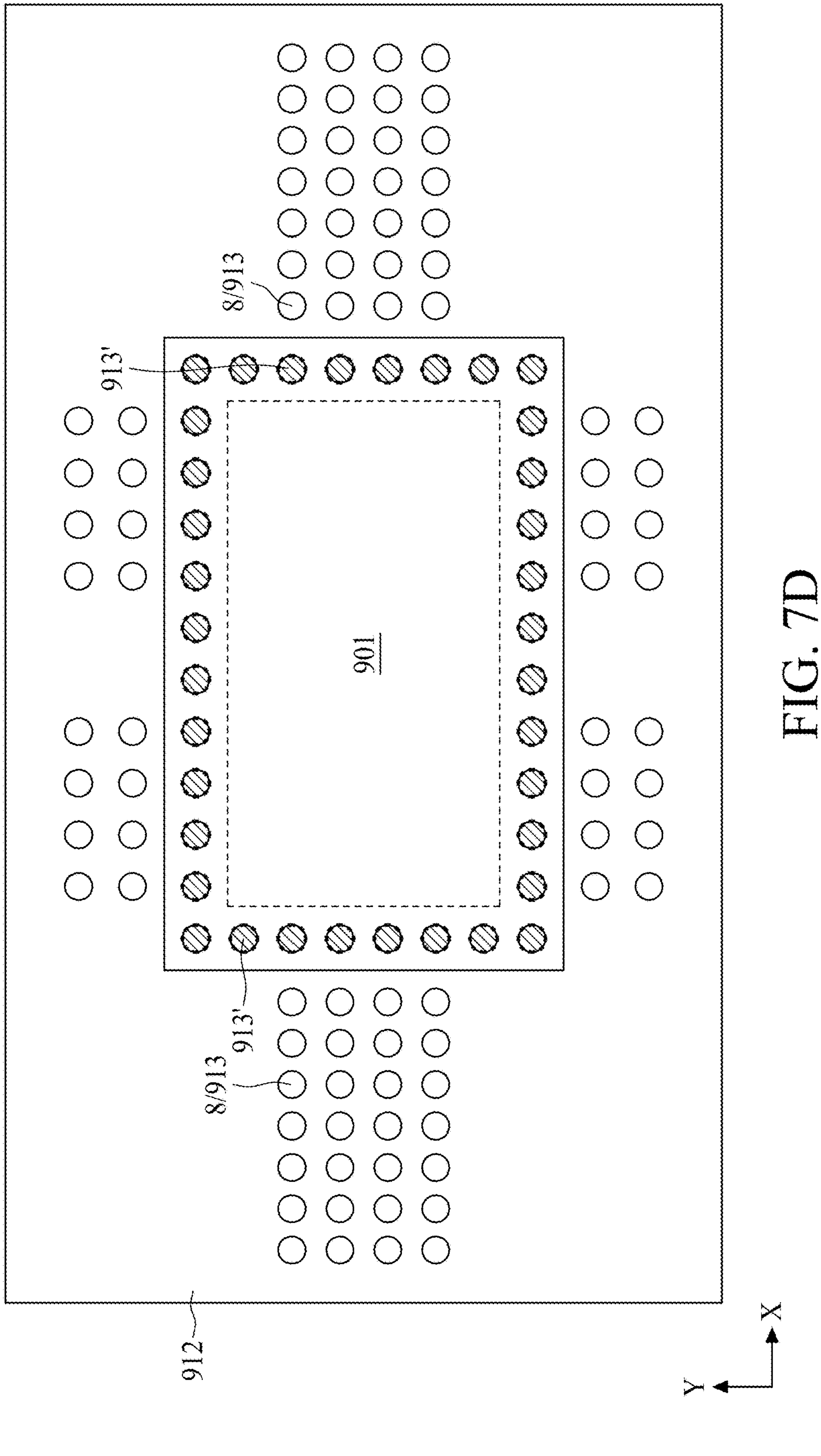
FIG. 7D is a top view of the semiconductor structure of FIG. 7B during intermediate stages of manufacturing operations, in accordance with some embodiments of the present disclosure.
Figure 7E:
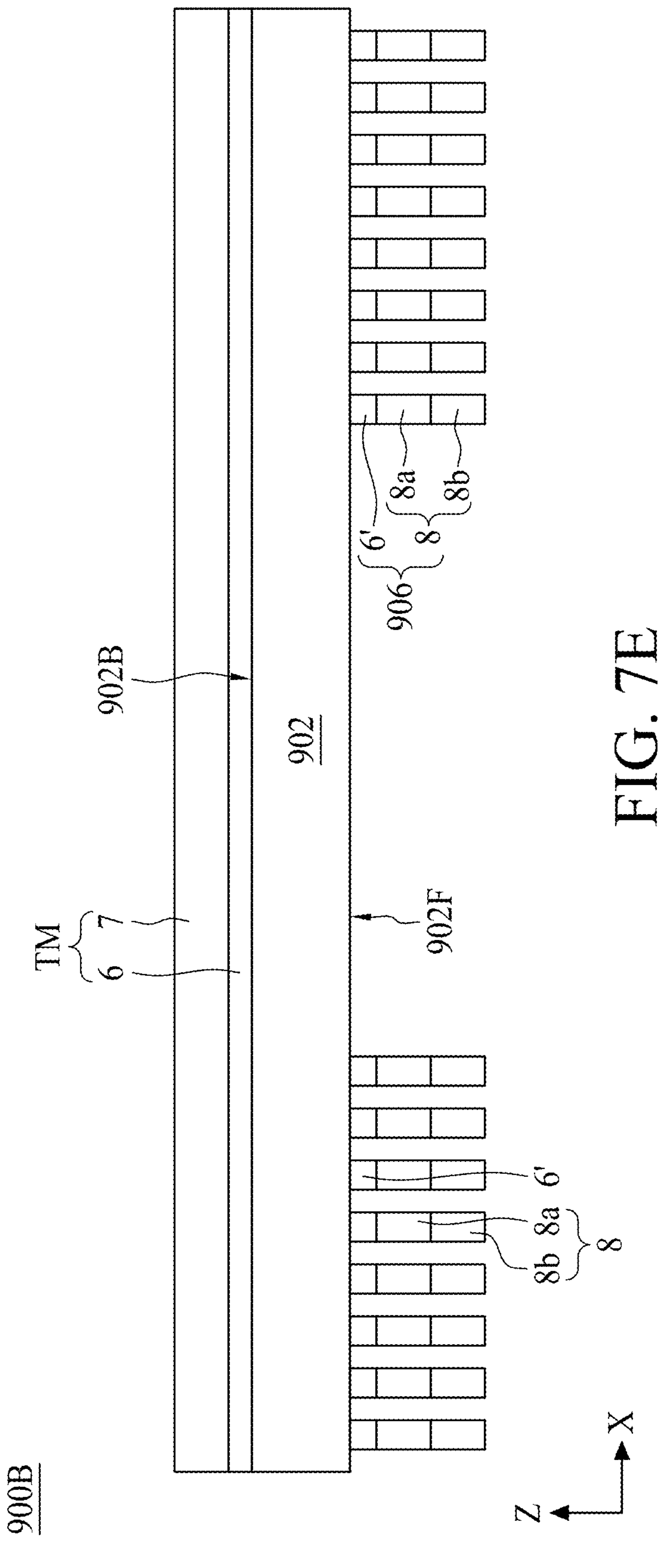
FIG. 7E is a cross-sectional view of a semiconductor structure during intermediate stages of manufacturing operations, in accordance with some embodiments of the present disclosure.
Figure 7F:
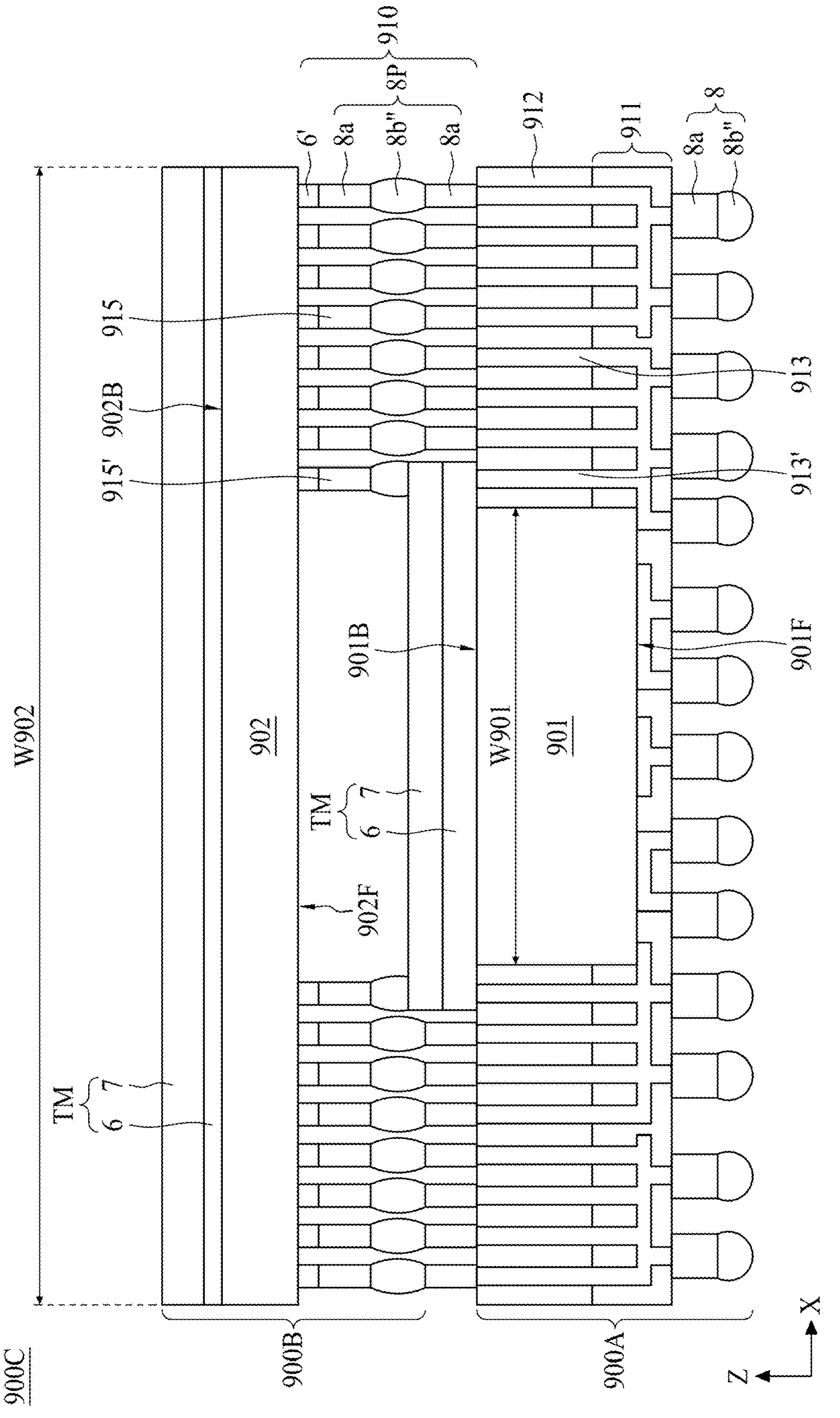
FIG. 7F is a cross-sectional view of a package structure during intermediate stages of manufacturing operations, in accordance with some embodiments of the present disclosure.

Referring to FIG. 7D, FIG. 7D is a top view of a semiconductor structure during intermediate stages of manufacturing operations. The top view shown in FIG. 7D is similar to the top view shown in FIG. 7C, except that FIG. 7C shows the grounding vias 913' are arranged to surround two opposite sides of the first die 901 or the copper-phosphorous alloy layer 7 (or the interfacial layer 6) from a top-view perspective, while FIG. 7D shows the grounding vias 913' are arranged to surround four sides of the first die 901 or the copper-phosphorous alloy layer 7 (or the interfacial layer 6) from a top-view perspective. The grounding via 913' may be arranged between the through vias 913 and the first die 901. In some embodiments, the grounding vias 913' are also configured to provide shielding of electromagnetic interference (EMI) for the first die 901 from four sides thereof. The heat dissipation area of the grounding vias 913' can be increased greatly due to the arrangement of the grounding vias 913' on four sides of the first die 901, and therefore the heat dissipation performance shown in FIG. 7D can thus be significantly improved. Sometimes, the combination of both the conductive grounding circuits and the grounding through vias 913' can increase the thermal dissipation efficiency of applying only the thermal management structure TM by 30-40%. Thus, they are two key points of this invention.

Referring to FIG. 7E, FIG. 7E is a cross-sectional view of a semiconductor structure during intermediate stages of manufacturing operations, in accordance with some embodiments of the present disclosure. A second die 902 is provided, wherein the second die 902 has a front surface 902F and a back surface 902B opposite to the front surface 902F. In some embodiments, the second die 902 is a memory die that is provided with one or more memory devices. In some embodiments, the second die 902 may be a dynamic random-access memory (DRAM) die or a flash memory die. A plurality of interfacial layers 6' are formed over the portion of the second die 902 (wherein an area of the interfacial layer 6' can be defined by a sacrificial photoresist or dry film). Pillars 8 can be formed over each interfacial layer 6'. The composition of the interfacial layer 6' may be similar to the aforementioned interfacial layer 6. In some embodiments, the pillar 8 is a multilayer structure, for example, the pillar 8 includes a conductive pillar 8*a* and an alloy layer 8*b* over the conductive pillar 8*a*. The conductive pillar 8*a*, the alloy layer 8*b* and the interfacial layer 6' may be collectively referred to herein as a bumping structure 906 of the second die 902 and are configured to be electrically connected to the first die 901.

An interfacial layer 6 is formed over the back surface 902B of the second die 902 and a copper-phosphorous alloy layer 7 (which may be made of $Cu_3P$) is formed over the interfacial layer 6, thereby forming a second structure 900B. A composition of the interfacial layer 6 is discussed with reference to FIG. 6. In some embodiments, the interfacial layer 6 may be formed by an electroless plating operation with thickness lower than 1 μm, and the copper-phosphorous alloy layer 7 may be formed by electroless plating and electroplating operations with thickness lower than 200 μm, while the interfacial layers 6' and the pillars 8 may be protected by a photoresist layer or a tape (not shown) during the electroless plating operation. Herein the interfacial layer 6 and the copper-phosphorous alloy layer 7 are collectively referred to as a thermal management structure TM thermally coupled to the back surface 902B of the dies 902.

Referring to FIG. 7F, FIG. 7F is a cross-sectional view of a package structure during intermediate stages of manufacturing operations, in accordance with some embodiments of the present disclosure. The first structure 900A shown in FIG. 7B is bonded to the second structure 900B shown in FIG. 7E so that the first die 901 and the second die 902 can be stacked in a vertical direction. In some embodiments, the first die 901 overlaps the second die 902 in the vertical direction. In some embodiments, the back surface 901B of the first die 901 faces toward the front surface 902F of the second die 902 after bonding the first structure 900A to the second structure 900B. Pillars 8 on the fan-out region RO over the back surface 901B of the first die 901 are connected to the corresponding pillars 8 over the front surface 902F of the second die 902. In some embodiments, some of the pillars 8 over the front surface 902F of the second die 902 are connected to the copper-phosphorous alloy layer 7 over the front surface 901F of the first die 901. In some embodiments, the alloy layer **8*b* of the pillars 8 in the first structure 900A (shown in FIG. 7B) merges with the alloy layer 8*b* of the pillars 8 in the second structure 900B (shown in FIG. 7E), and a reflow operation or thermo-compression bonding is performed to convert the alloy layers 8 *b* into a plurality of solder balls 8*b*'' to strengthen the bonding between the first structure 900A and the second structure 900B. Thus the difference between the thickness T804 and the thickness T803 in FIG. 6 is not so critical. Thereby, a package structure 900C is formed. The two conductive pillars 8*a*, the two solder balls 8*b*'' and the interfacial layer 6' between the first structure 900A and the second die 902 may be collectively referred to herein as the bumping structure 910 of the second structure 900B and electrically connect the first die 901 to the second die 902. In some embodiments, the plurality of bumping structures 910 arranged between the first structure 900A and the second die 902 include a first (type) bump 915 and a second (type) bump 915'. The first (type) bumps 915 are arranged to electrically couple the conductive vias 913 of the first structure 900A to the second die 902, while the second (type) bumps 915' are arranged proximal to the first die 901 and thermally couple the interfacial layer 6 and the copper-phosphorous alloy layer 7 to the second die 902. In some embodiments, due to the effect of gravity, a shape of the solder balls 8*b*'' may be similar to an ellipsoid, a rugby shape, or an American football shape. Each solder ball 8*b*'' is separated from each other to avoid electrical short-circuit issues. In some embodiments, the pillars 8** formed of copper plugs encapsulated by insulating materials are preferred over those formed of through-silicon vias for the low cost of the copper plugs.

Embodiment(s) of a package structure in FIG. 7E provided with the heat spreaders will be subsequently discussed with reference to FIG. 8. Specifically, FIG. 8 shows an approach of: forming a first die provided with the thermal management structure and the heat spreader(s), forming a second die provided with the thermal management structure and the heat spreader(s), and bonding the first die to the second die.

Figure 8:
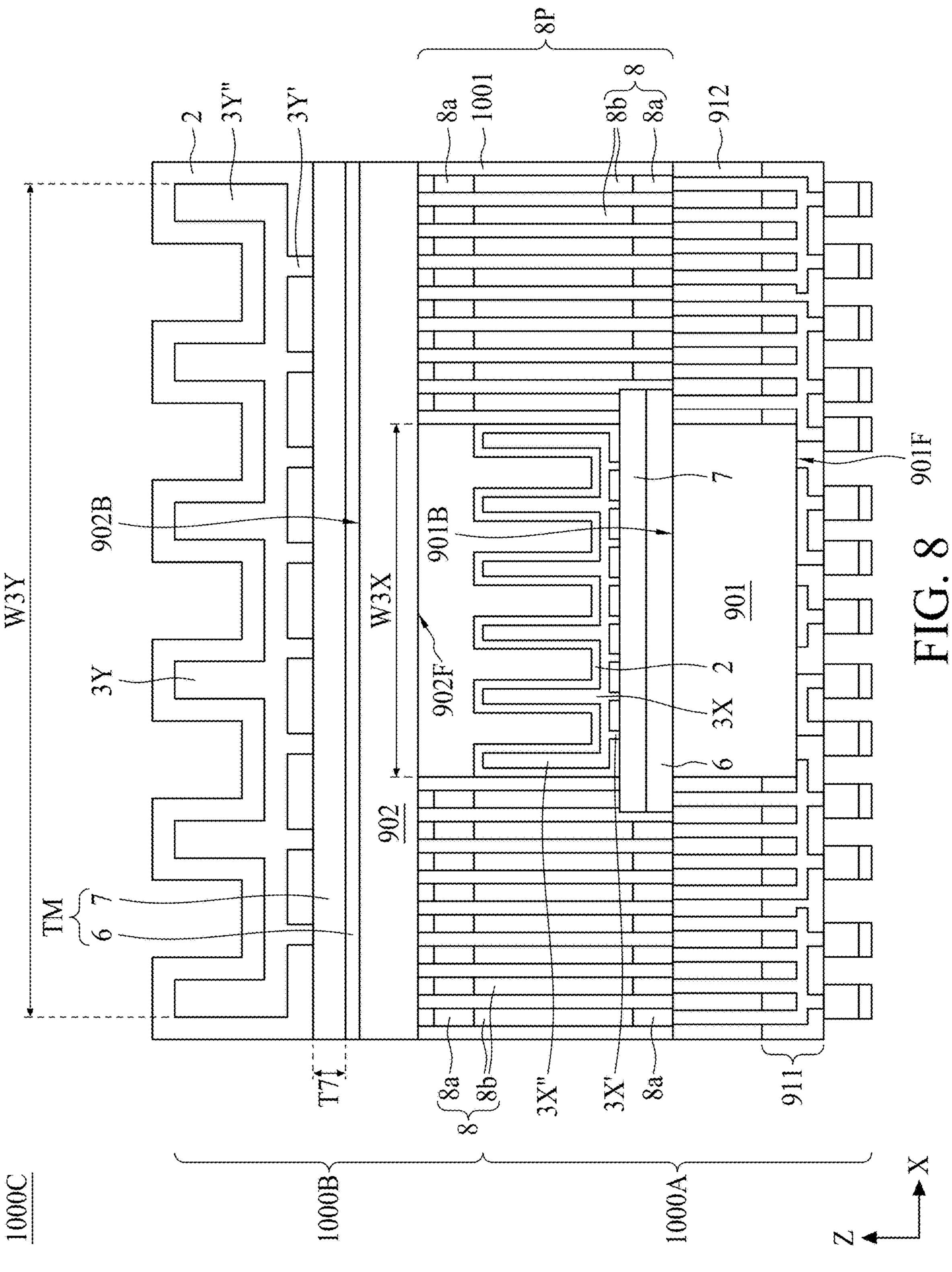
FIG. 8 is a cross-sectional view of a package structure, in accordance with some embodiments of the present disclosure.

Referring to FIG. 8, FIG. 8 is a cross-sectional view of a package structure, in accordance with some embodiments of the present disclosure. The package structure 1000C includes a first structure 1000A and a second structure 1000B stacked over the first structure 1000A. The first structure 1000A is similar to the first structure 900A discussed with reference to FIG. 7B. However, the difference resides in that a thickness of the alloy layer **8*b* (or the thickness of the entire pillar 8) for the first structure 1000A is further increased (for example, by repeating some of the operations to deposit the solder alloy by several times discussed with reference to FIG. 7A). Further, one or more heat spreaders 3X are disposed on the copper-phosphorous alloy layer 7 over the back surface 901B of the first die 901. In some embodiments, the heat spreaders 3X may include materials such as copper, foam copper, aluminum, thermal conductive metal, ceramic, $Al_2O_3$, AlN, or the like. In some embodiments, in order to improve the efficiency of thermal dissipation, a surface area of each heat spreader 3X can be designed to be greater than a surface area of a cube-shaped heat spreader with a similar volume. In some embodiments, a heat spreader 3X may have one or more surfaces with a corrugated profile. For example, each heat spreader 3X may have a plurality of protrusions on the upper one sides and/or the lower sides, such as a plurality of first fin-type protrusions 3X' facing toward the first die 901, and a plurality of second fin-type protrusions 3X'' facing away from the first die 901. In some embodiments, the heat spreaders 3X may have a plurality of recesses or holes. Further, a copper-phosphorous alloy material layer 2 (which may be made of $Cu_3P$) is formed over the surface area of the heat spreaders 3X, for example, the copper-phosphorous alloy material layer 2 covers the plurality of first fin-type protrusions 3X' and the plurality of second fin-type protrusions 3X''. The copper-phosphorous alloy material layer 2 may be referred to as a coating layer coated on the heat spreaders 3X. In some embodiments, since the heat spreaders 3X are provided with the plurality of first protrusions 3X', the copper-phosphorous alloy material layer 2 can be formed in a gap between the heat spreaders 3X and the copper-phosphorous alloy layer 7 by using an electroplating operation. In some embodiments, the wettability of a copper-phosphorous alloy 2 improves the accessibility of forming the copper-phosphorous alloy in the gap. The combination of the copper-phosphorous alloy material layer 2 and the copper-phosphorous alloy layer 7 improves the mechanical strength, adherence as well as reliability of the heat spreaders 3X. Further, the copper-phosphorous alloy material layer 2 and the copper-phosphorous alloy layer 7** possess great thermal conductivity, thereby providing a better means for heat dissipation and temperature management.

In addition, the copper-phosphorous alloy layer 7 can be formed by an electroless plating operation to obtain a denser structure, while the copper-phosphorous alloy material layer 2 can be formed by an electroplating operation to obtain a thicker layer with improve efficiency. Further, using electroplating operation may help improving the coverage of copper-phosphorous alloy material layer 2 over the heat spreaders 3X and the accessibility into gaps or holes.

The second structure 1000B is similar to the second structure 900B discussed with reference to FIG. 7E. However, the difference resides in that one or more heat spreaders 3Y are further disposed on the copper-phosphorous alloy layer 7 over the back surface 902B of the second die 902. In some embodiments, the heat spreaders 3Y may include materials such as copper, foam copper, aluminum, thermal conductive metal, ceramic, $Al_2O_3$, AlN, or the like. In some embodiments, in order to improve the efficiency of thermal dissipation, a surface area of each heat spreader 3Y can be designed to be greater than that of a cube-shaped heat spreader. In some embodiments, a heat spreader 3Y may have one or more surfaces with a corrugated profile. For example, each heat spreader 3Y may have a plurality of protrusions on one side or two sides, such as a plurality of first protrusions 3Y' facing toward the second die 902, and a plurality of second protrusions 3Y" facing away from the second die 902. In some embodiments, the heat spreaders 3Y may have a plurality of recesses or holes. In some embodiments, a width W3Y of the heat spreader 3Y is greater than a width W3X of the heat spreader 3X. Further, a copper-phosphorous alloy material layer 2 (which may be made of $Cu_3P$) is formed over the surface area of the heat spreaders 3Y, for example, the copper-phosphorous alloy material layer 2 covers the plurality of the first protrusions 3Y' and the plurality of the second protrusions 3Y". In some embodiments, since the heat spreaders 3Y are provided with the plurality of first protrusions 3Y', the copper-phosphorous alloy material layer 2 can be formed in a gap between the heat spreaders 3Y and the copper-phosphorous alloy layer 7 by using an electroplating operation.

Further, using an electroplating operation may help improving the coverage of the copper-phosphorous alloy material layer 2 over the heat spreaders 3Y and the accessibility into gaps or holes. In some embodiments, the second die 902 is a logic with somewhat larger power dissipation, and is connected with either one or more memory devices 901 with lower dissipation. In some embodiments, the second die 902 may be a DRAM die or a flash memory die.

In some embodiments, a thickness of the alloy layer **8*b* (or the thickness of the entire pillar 8) of second structure 1000B can be further increased by repeating the operations to deposit the solder alloy by several times discussed with respect to FIG. 7B. 7**E.

The first structure 1000A is bonded to the second structure 1000B, wherein the back surface 901B of the first die 901 faces toward the front surface 902F of the second die 902. A plurality of the pillars 8 of the first structure 1000A (shown in FIG. 8) are connected to the corresponding pillars 8 of the second structure 1000B (shown in FIG. 8). A reflow operation can be performed and the pillars 8 of the first structure 1000A merge with the pillars 8 of the second structure 1000B, thereby forming a plurality of bumping structures 8P. The bumping structure 8P after the bonding of the first structure 900A to the second structure 900B includes the pillar 8 of the first structure 900A shown in FIG. 7B and the bumping structure 910 shown in FIG. 7E. Note the configuration of both bumping structures 8P should be respectively with a greater height, and there exist a gap between the heat spreader 3X and the die 902 in order for air convection. Thus the first die 901 can be stacked with the second die 902 in the vertical direction without causing interference (i.e. two elements are undesirably in physical contact at certain positions, but the surface tension forces generated by both sides of the solders can cover this alignment problem in the reflow operation). In some embodiments, the first die 901 overlaps the second die 902 vertically. Further, an underfill layer 1001 is formed to cover the sidewalls of the bumping structures 8P, thereby forming a package structure 1000C. In some embodiments, the underfill layer 1001 encapsulates the bumping structures 8P. The underfill layer 1001 may be between the molding compound 912 of the first structure 1000A and the second die 902 of the second structure 1000B. In some embodiments, the underfill layer 1001 may be no-flow underfill and the underfill layer 1001 may be substantially free from being in direct contact with the first die 901. This may avoid the underfill layer 1001 from significantly hindering thermal dissipation, thereby improving the thermal dissipation ability of the package structure 1000C.

Figure 9A:
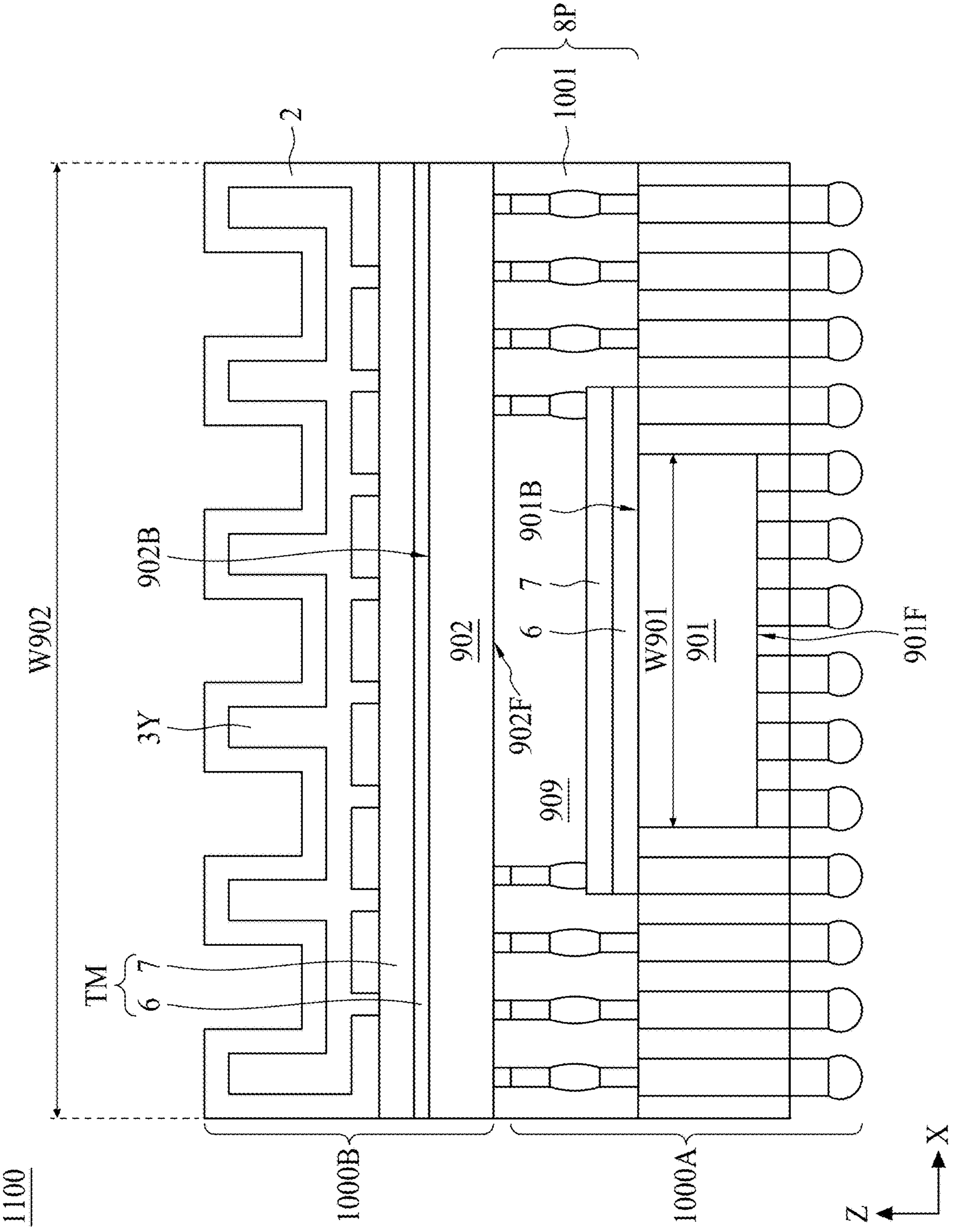
FIG. 9A is a cross-sectional view of a package structure, in accordance with some embodiments of the present disclosure.
Figure 9B:
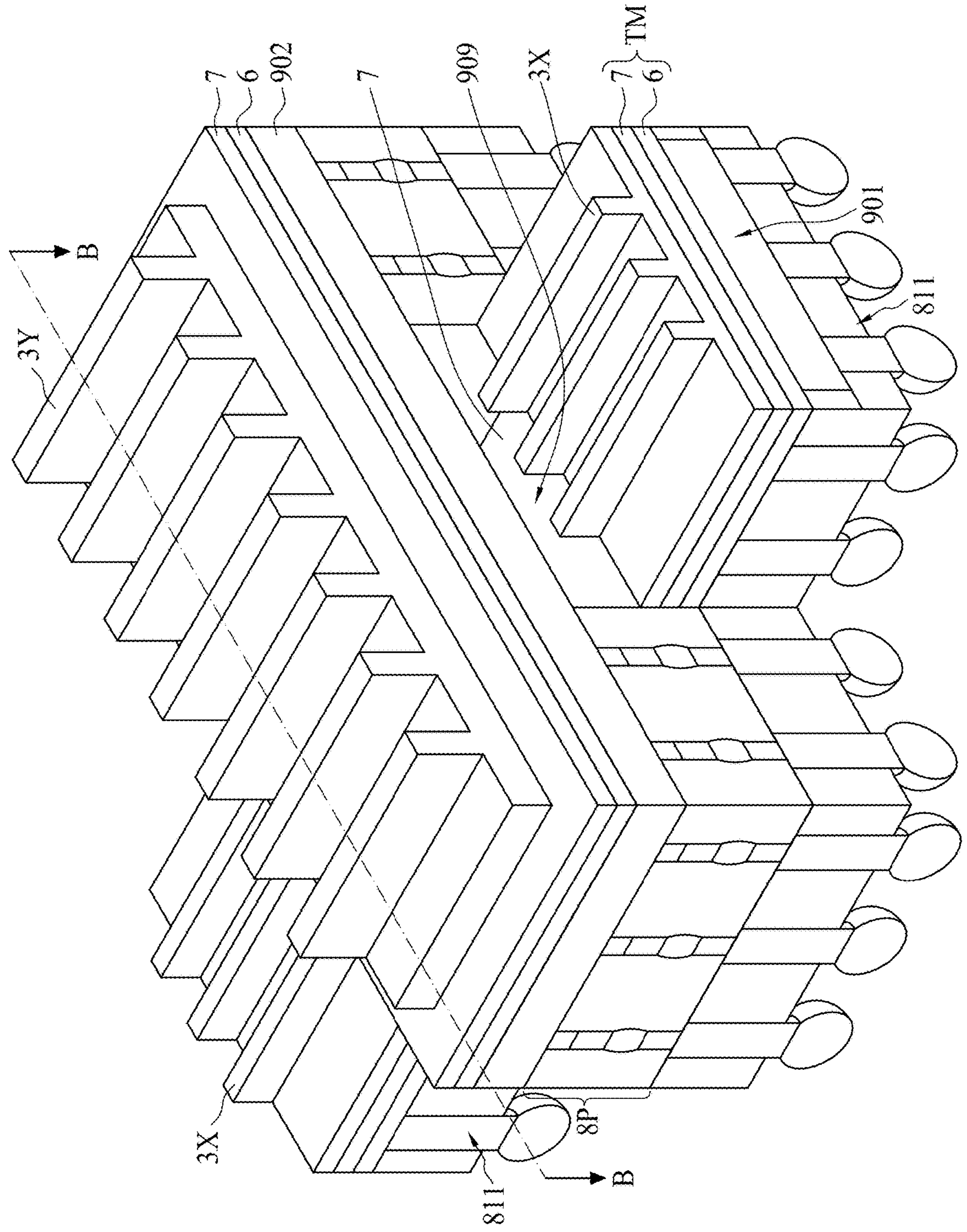
FIG. 9B is a perspective view of the package structure shown in FIG. 9A, in accordance with some embodiments of the present disclosure.

Embodiment(s) of a package structure provided with the thermal management structure and the heat spreaders will be subsequently discussed with reference to FIG. 9A and FIG. 9B. Such configuration further allows the accommodation of some push-pull drivers such as: the first die 901 is a MIMO solutions of Driver Amplifier set #1 for 5G wireless systems, its copper pillars attach to an interposer substrate (not shown). The second die 902 is another set of Driver Amplifiers #2. So the thermal management should be added. To tradeoff the space and reduce the interferences of electromagnetic interference (EMI) and thermal convection problems produced by both large driver-currents, one can put both dies as shown in FIG. 9A and FIG. 9B in a crossing (e.g. perpendicular) manner from a top-view perspective, and partly stacking them instead of setting both on a plane with the same level. In some alternative embodiments, a heat spreader 3X (shown in FIG. 9A) can be placed between the second die 902 and the copper-phosphorous alloy layer 7 over the first die 901. In some embodiments, referring to FIG. 9B, the lower side of the heat spreader 3X is substantially leveled with the upper surface of the copper-phosphorous alloy layer 7 below the heat spreader 3X, and the upper sides of the heat spreader 3X on the two ends may extend over the second die 902, but the middle region of 3X cannot touch with the second die 902 for air convection. In some embodiments, at least a portion of the heat spreaders 3X is substantially leveled with the second die 902.

Referring to FIG. 9A and FIG. 9B, FIG. 9A is a cross-sectional view of a package structure, FIG. 9B is a perspective view of the package structure shown in FIG. 9A, in accordance with some embodiments of the present disclosure. The cross-sectional view of FIG. 9A is drawn along the sectional-line BB shown in FIG. 9B. The package structure 1100 shown in FIG. 9A and FIG. 9B is similar to the package structure 1000C shown in FIG. 8, however the difference resides in that, instead of an increased height of the bumping structures 8P, the configurations of heat spreaders 3X as well as the copper-phosphorous alloy material layer 2 formed over the heat spreaders 3X are changed. In some embodiments, referring to FIG. 9B, the lateral sides of the heat spreader 3X are substantially leveled with those lateral sides of the first die 901.

Referring to FIG. 9B, an additional thermal management structure TM formed between the first die 901 and the second die 902 is thermally coupled to the first die 901. A space (5-10 μm) may be reserved between the first die 901 and the second die 902. Such space may be filled by the underfill layer 1001. Particularly, a plurality of heat spreaders 3X are placed over the copper-phosphorous alloy layer 7 of the first die 901 (the copper-phosphorous alloy material layer 2 covering the heat spreaders 3Y is only depicted in FIG. 9A but omitted from FIG. 9B for clarity). A portion or an entirety of the heat spreader 3X may be free from overlapping the first die 901 or the second die 902 along the vertical direction. Thus the thermal dissipation paths of the dies may not interfere with each other. In some embodiments, there is no heat spreader 3X placed between the second die 902 and the copper-phosphorous alloy layer 7 over the first die 901. Such configuration further allows the accommodation of some special conditions. In some alternative embodiments, a smaller heat spreader 3X can be placed between the second die 902 and the copper-phosphorous alloy layer 7 over the first die 901. In some embodiments, referring to FIG. 9B, the lower side of the heat spreader 3X is substantially leveled with the upper surface of the copper-phosphorous alloy layer 7 below the heat spreader 3X, and the upper sides of the heat spreader 3X may extend over the second die 902. In some embodiments, at least a portion of the heat spreaders 3X is substantially leveled with the second die 902. In some embodiments, the first die 901 has a die width W901 from a cross-sectional view or top-view perspective. In some embodiments, the second die 902 has a die width W902 from a cross-sectional view or top-view perspective. The die width W902 may be greater than the die with W901. In some embodiments, the first die 901 has a first die length measured from a direction perpendicular to the sectional line BB, and the second die 902 has a second die length measured from a direction perpendicular to the sectional line BB. As shown in FIG. 9B, the first die length is greater than the second die length, but in other embodiments, the first die length can be substantially equal to the second die length.

Embodiment(s) of a package structure provided with the thermal management structure and the heat spreaders will be subsequently discussed with reference to FIG. 10. Specifically, FIG. 10 shows a package structure of a tablet computer with a first module consisted by stacking several (e.g. two) DRAM dies and a second die (logic die) connected in a horizontal direction.

Figure 10:
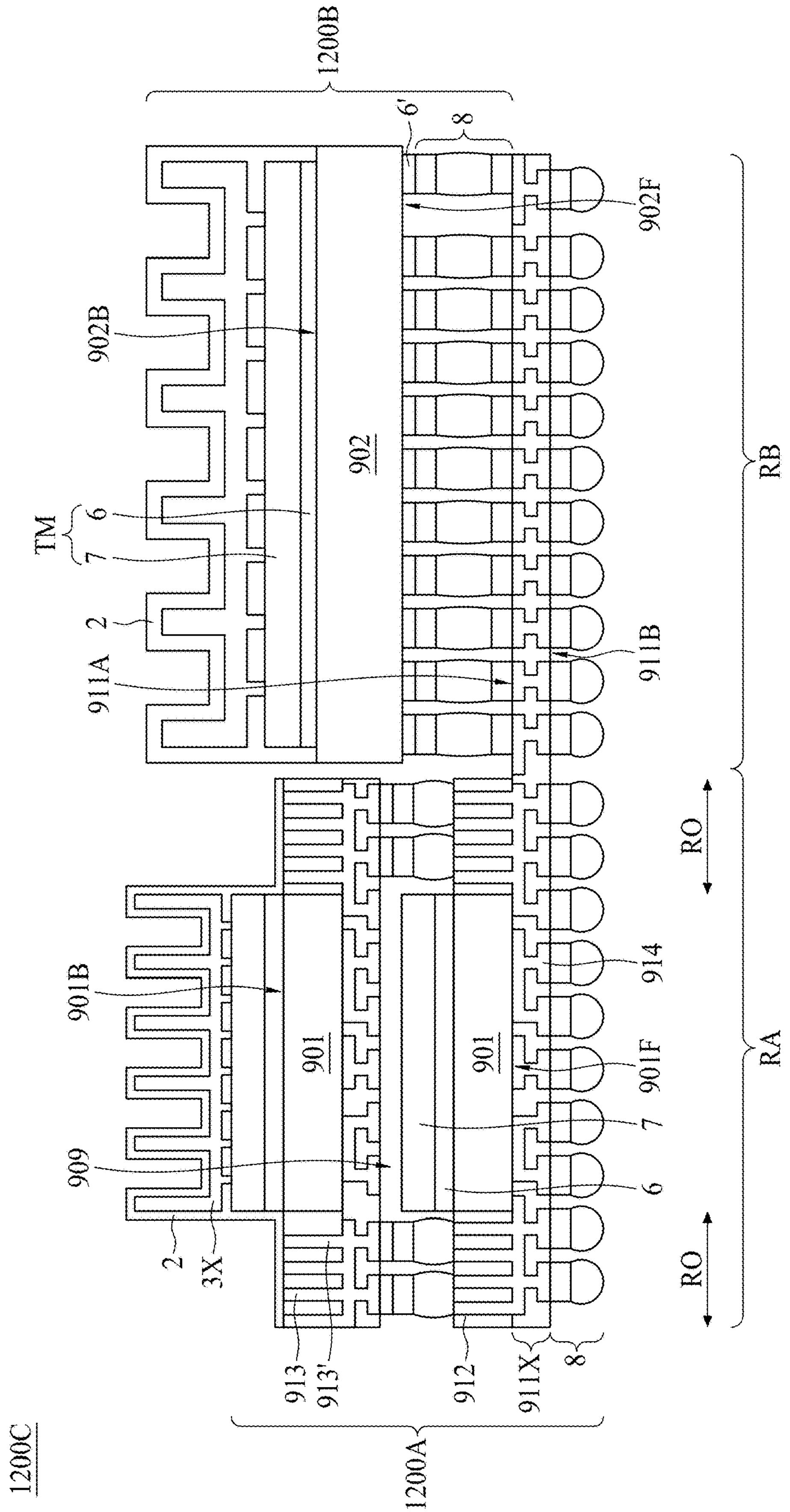
FIG. 10 is a cross-sectional view of a package structure, in accordance with some embodiments of the present disclosure.

Referring to FIG. 10, FIG. 10 is a cross-sectional view of a package structure, in accordance with some embodiments of the present disclosure. The package structure 1200C includes a first structure 1200A and a second structure 1200B disposed alongside the first structure 1200A. The first structure 1200A depicted in FIG. 10 is similar to the first structure 1000A discussed with reference to FIG. 8, but the differences reside in that the first structure 1200A has a wider redistribution layer, which is hereby denoted as an RDL 911X, wherein the RDL 911X has a first area RA and a second area RB adjacent to the first area RA. The first die 901 is disposed over the first area RA. Further, the pillars are disposed over the molding compound 912 at the fan-out region RO where the second DRAM stacks on it. Using the same method previously described one can stack a second DRAM (provided with the thermal management structure and the heat spreader) on the first one. In some embodiments, the copper-phosphorous alloy material layer 2 on the second DRAM further extends over the molding compound 912 and covers the conductive vias 913. However, the grounding conductive vias 913' may not touch the copper-phosphorous alloy layer 7 on the back side of the first die 901 for thermal conduction. Subsequently electroless plating interfacial layer 6 and copper-phosphorous alloy layer 7 on the back side 901B of the second die. In addition to cover a heat spreader on the backside of the second die, a layer of copper-phosphorous alloy material 2 is also electroplated over the fan-out region RO and covers the grounding conductive vias 913' to increase the thermal dissipation area. Instead of using TSV interposer to stack a set of DRAMs, the FOWLP technology can not only reduce the cost but increase the yield rate. In some embodiments, there exists a gap 909 between the two layers of copper-phosphorous alloy 2 in order for air convection.

Further, the RDL 911X in the second area RB has a front surface 911F and a back surface 911B opposite to the front surface 911F. A plurality of conductive features 914 are disposed at the front surface 911F and the back surface 911B, and a plurality of pillars 8 are disposed on some of the conductive features 914 disposed at the front surface 911F and the back surface 911B. In some embodiments, the pillar 8 is a multilayer structure, for example, referring to FIG. 7A or FIG. 7B, the pillar 8 includes a conductive pillar 8*a* and an alloy layer 8*b* over the conductive pillar 8*a*.

The second structure 1200B depicted in FIG. 10 is similar to the second structure 1000B depicted in FIG. 8. In some embodiments, as shown in the second structure 1200B depicted in FIG. 10, the copper-phosphorous alloy material layer 2 may be in direct contact with a peripheral area of the second die 902. It should be noted that, in the case that needs to alleviate the stress applied to the second die 902, so the heat spreaders 3Y may be made of foam copper to lower the total weight of the tablet computer. In addition, the power dissipation of the second die (logic die) 902 is somewhat larger, so its thermal management should be specially considered.

The second structure 1200B is bonded over the second area RB, which is over the front surface 911F of the RDL 911X, to form a package structure 1200C. In some embodiments, the power dissipation of the second die 902 (logic die) is larger than the first die 901 (DRAM). A reflow operation is performed, so that the pillars 8 of the second structure 1200B and the pillars 8 over the front surface 911F of the RDL 911X can be merged and connected, and the lengthen joint can release the mechanical stress generated by the logic driver. By the way one can also stack several logic dies on the first logic die to make a multi-core computer by using the FOWLP technology.

Figure 11:
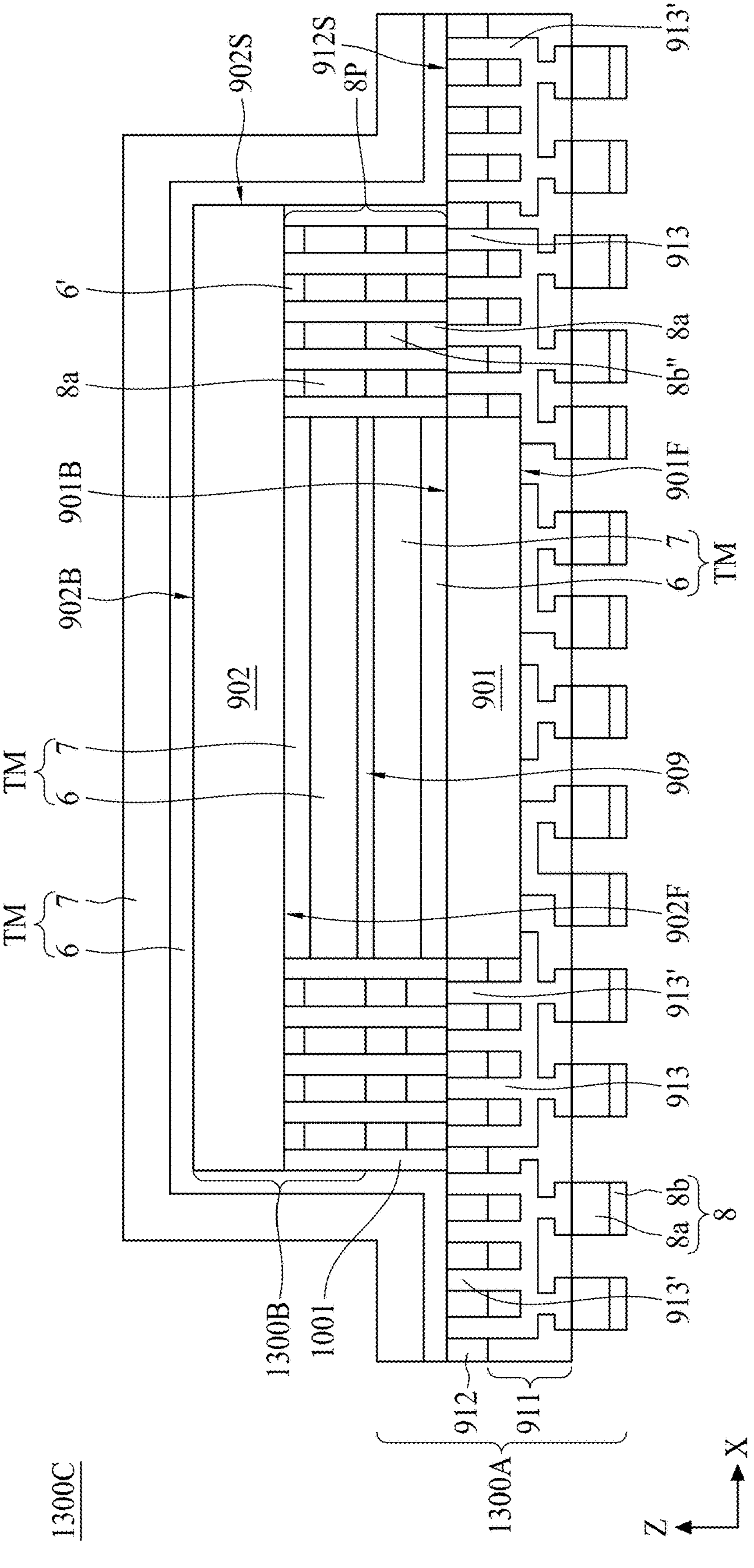
FIG. 11 is a cross-sectional view of a package structure, in accordance with some embodiments of the present disclosure.

Embodiment(s) of a package structure provided with the thermal management structures of a dual path RF transmitter will be subsequently discussed with reference to FIG. 11. Specifically, FIG. 11 shows an approach of connecting the first die (e.g. a mixer) and the second die (e.g. a power amplifier) in a vertical direction as well as forming the thermal management structure. Thus one should apply a shielding (and TM) plate to solve the problems of EMI and thermal dissipation produced by the power amplifier.

Referring to FIG. 11, FIG. 11 is a cross-sectional view of a package structure, in accordance with some embodiments of the present disclosure. The package structure 1300C includes a first structure 1300A and a second structure 1300B stacked over the first structure 1300A. The first structure 1300A discussed with reference to FIG. 11 is similar to the first structure 900A discussed with reference to FIG. 7B, FIG. 7C, and FIG. 7F, but the difference resides in that the configurations of the conductive vias 913 and the grounding vias 913' are different. In some embodiments, as shown in FIG. 11, the conductive vias 913 are disposed proximal to the first die 901, the grounding vias 913' are arranged in a peripheral area, and the conductive vias 913 may be between the grounding vias 913' and the first die 901.

The second structure 1300B (such as a dual path RF transmitter) discussed with reference to FIG. 11 is similar to the second structure 900B discussed with reference to FIG. 7E and FIG. 7F, but the difference resides in that the interfacial layer 6 and a copper-phosphorous alloy layer 7 of the second structure 1300B discussed with reference to FIG.

11 further extend over the fan-out region RO of the first structure 1300A, and which will be applied as a shielding plate for EMI/EMC consideration. The first structure 1300A is bonded to the second structure 1300B, wherein the back surface 901B of the first die 901 faces toward the front surface 902F of the second die 902.

A plurality of the pillars 8 of the first structure 1300A are connected to corresponding pillars 8 of the second structure 1300B. A reflow operation can be performed and the pillars 8 of the first structure 1300A may merge with the pillars 8 of the second structure 1300B, thereby forming a plurality of bumping structures 8P to reduce the mechanical stress generated by the second die of a dual path RF transmitter.

In some embodiments, the first die 901 overlaps the second die 902 vertically. Further, an underfill layer 1001 is formed to cover the sidewalls of the bumping structures 8P. At least a portion of the front surface 902F of the second die 902 and a portion of the back surface 901B of the first die 901 is exposed through the underfill layer 1001. In some embodiments, the underfill layer 1001 may be no-flow underfill.

An interfacial layer 6 is formed over the back surface 902B of the second die 902, over the front surface 902F of the second die 902 exposed through the underfill layer 1001, as well as over the back surface 901B of the first die 901 exposed from the underfill layer 1001. The interfacial layer 6 over the back surface 902B of the second die 902 may further extend over a side surface 902S of the second die 902, a sidewall of the underfill layer 1001, over a first surface 912S of the molding compound 912 in the fan-out region RO (which faces away from RDL 911), and over the grounding vias 913'. In some embodiments, the first surface 912S of the molding compound 912 is leveled with the back surface 901B of the first die 901. A copper-phosphorous alloy layer 7 (which may be made of $Cu_3P$) is formed over each interfacial layer 6, thereby forming a package structure 1300C. The interfacial layer 6 and the copper-phosphorous alloy layer 7 formed thereon are collectively referred to as a thermal management structure TM as well as a shielding plate for EMI/EMC consideration. In some embodiments, there exists a gap 909 between both layers of copper-phosphorous alloy 2 in order for air convection.

In some embodiments, the interfacial layer 6 may be formed by an electroless plating operation and the copper-phosphorous alloy layer 7 may be formed by an electroplating operation, wherein each of the interfacial layers 6 (the one over the back surface 902B of the second die 902, the one over the front surface 902F of the second die 902, and the one over the back surface 901B of the first die 901) can be formed in a single operation, and the copper-phosphorous alloy layer 7 over each aforesaid interfacial layer 6 can also be formed in a single operation. Optionally, a sacrificial layer can be formed to protect specific parts of the first structure 1300A or the second structure 1300B during the plating operation for forming the interfacial layer 6 and the copper-phosphorous alloy layer 7.

Further, the grounding vias 913' are connected to the interfacial layer 6 and the copper-phosphorous alloy layer 7 that extends from the back surface 902B of the second die 902 to an area over a first surface 912S of the molding compound 912. Such configuration can not only address the issues regarding electromagnetic compatibility (EMC) but address the issue regarding the electromagnetic interference (EMI) of the package structure 1300C.

Embodiments of a package structure provided simultaneously with the thermal management structures as well as a shielding plate for EMI/EMC consideration will be subsequently discussed with reference to FIG. 12.

Figure 12:
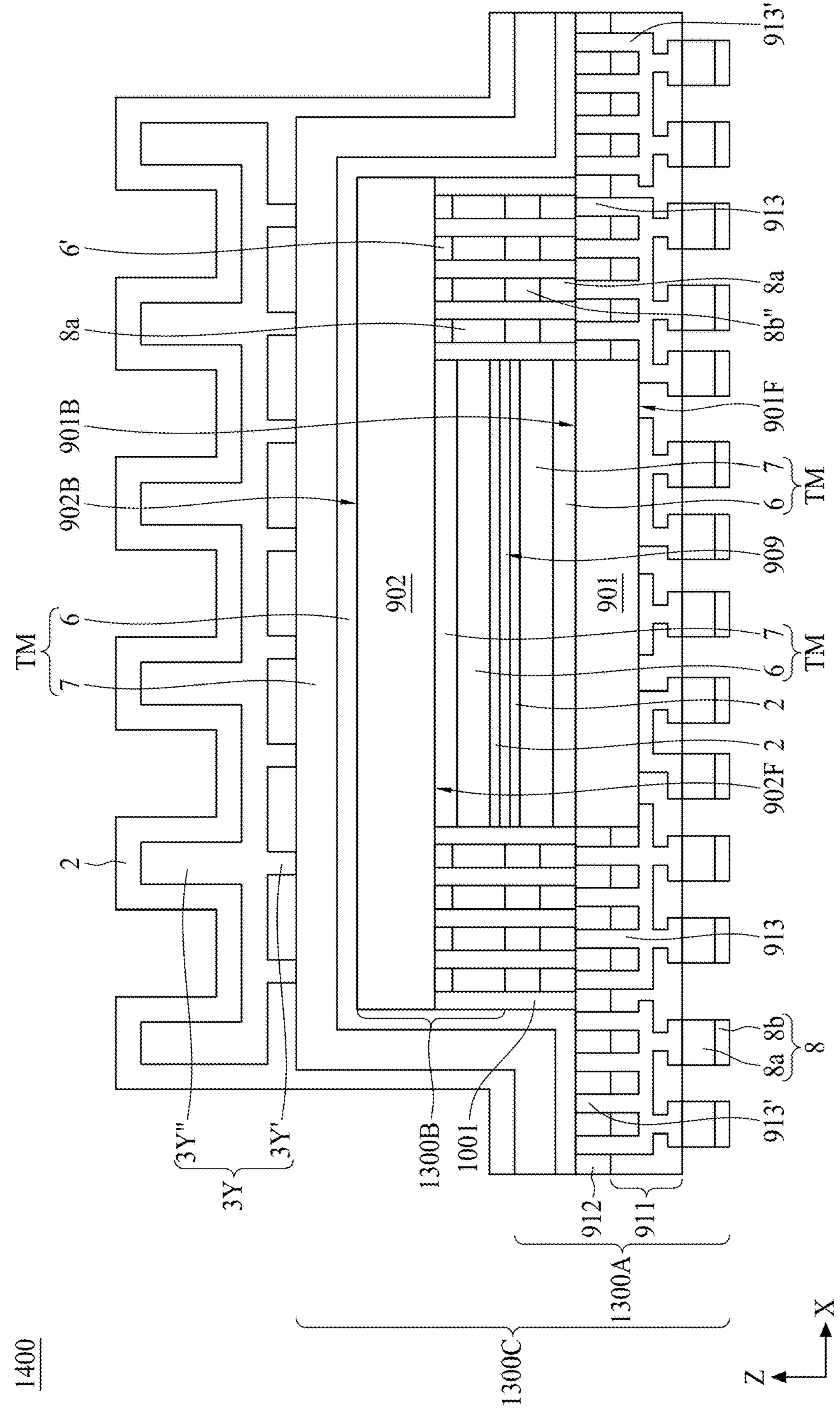
FIG. 12 is a cross-sectional view of a package structure, in accordance with some embodiments of the present disclosure.

Referring to FIG. 12, FIG. 12 is a cross-sectional view of a package structure, in accordance with some embodiments of the present disclosure. A package structure 1400 depicted in FIG. 12 is similar to the package structure 1300C shown in FIG. 11, but the difference resides in that the one or more heat spreaders 3Y are further disposed on the copper-phosphorous alloy layer 7 over the back surface 902B of the second die 902, and a copper-phosphorous alloy material layer 2 (which may be made of $Cu_3P$) is formed over the surface area of the heat spreaders 3Y, for example, the copper-phosphorous alloy material layer 2 covers the plurality of first protrusions 3Y' and the plurality of second protrusions 3Y". The details of the heat spreaders 3Y can be found by referring back to discussions with reference to FIG. 8. In some embodiments, the heat spreaders 3Y may include materials such as copper, foam copper, aluminum, thermal conductive metal, ceramic, $Al_2O_3$, AlN, or the like. In addition, the copper-phosphorous alloy layer 7 can be formed by an electroless plating operation to obtain a denser structure, while the copper-phosphorous alloy material layer 2 can be formed by an electroplating operation to obtain a thicker layer with improved efficiency. In some embodiments, the copper-phosphorous alloy material layer 2 conforms to a profile of a top surface and a sidewall of the copper-phosphorous alloy layer 7 over the back surface 902B of the second die 902. In some embodiments, a copper-phosphorous alloy material layer 2 can be formed over the other copper-phosphorous alloy layers 7. Note there exists a gap 909 between both layers of copper-phosphorous alloy 2 over 901B and 902F for air convection.

Embodiments of a package structure including multiple dies will be subsequently discussed with reference to FIG. 13.

Figure 13:
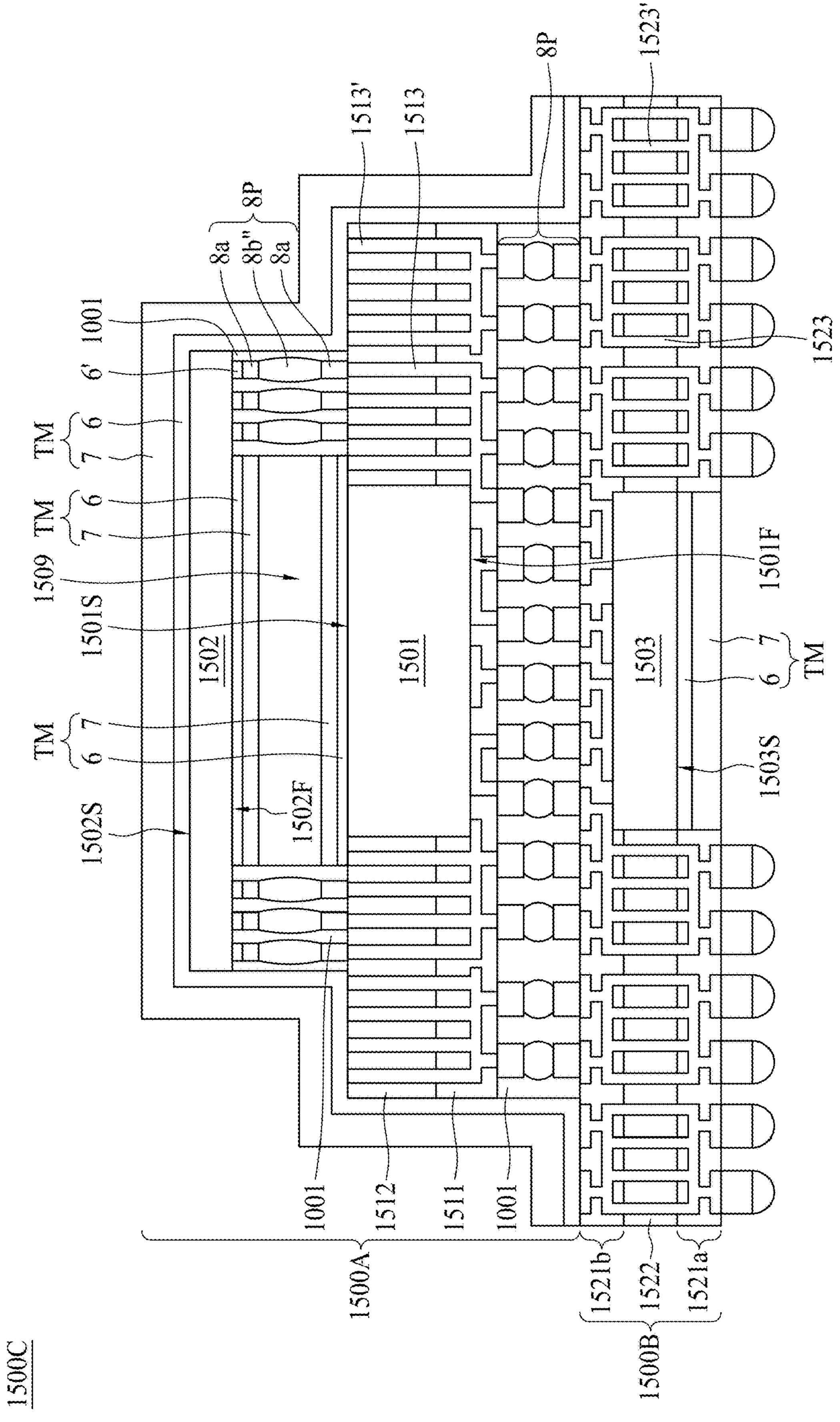
FIG. 13 is a cross-sectional view of a package structure, in accordance with some embodiments of the present disclosure.

Referring to FIG. 13, FIG. 13 is a cross-sectional view of a package structure, in accordance with some embodiments of the present disclosure. A first structure 1500A includes a primary die 1501 and a secondary die 1502 bonded to the primary die 1501. In some embodiments, the primary die 1501 may be a processor die, such as a central processing unit (CPU) die provided with one or more processing units. The secondary die 1502 may be a logic die provided with one or more logic devices. The tertiary die 1503 is provided with one or more memory devices. The first structure 1500A further includes two kinds of fan-out interposer FO as follows.

The first fan-out interposer FO is made of layers of ceramic thin films, and one should apply the second FOWLP method of chip-last (also known as RDL first), i.e. the chips are not integrated into the packaging processes until the RDL (including the conductive vias 1513 and grounding vias 1513' formed in the fan-out region (FO)) as well as the bumping structures 8P of copper pillars on both sides of the RDL are pre-formed. The primary die 1501 has a first (front) surface 1501F and a second (back) surface 1501S opposite to the first surface 1501F. The next is to bond both the die 1501 and the ceramic RDL by depositing a silver paste on the die pad, and then cure the silver paste. The thermal performance of such kind of ceramic RDL is better for high performance power devices. The other processes and notes are similar to those with reference to the previously-discussed first method. Note the method to package the dies can be changed depending on the overall performances. The interposers applied in FIG. 13 is just for illustration. The conductive vias 1513 may be between the grounding vias 1513' and the primary die 1501. Further, a plurality of conductive pillars 8_a_ and solder balls 8_b_" (which may be made of tin-silver alloy) may be disposed over each conductive features 1514 (not shown) exposed through the RDL 1511. The next is to flip-chip bond the die 1501 on the ceramic RDL. The thermal performance of such kind of ceramic RDL is better for high performance power devices. The other processes and notes are similar to those with reference to the previously-discussed first method. Note the method to package the dies can be changed depending on the overall electrical, thermal management as well as cost performances. The interposers applied in FIG. 13 is just for illustration. Furthermore, the secondary die 1502 is flip-chip bonded to the primary die 1501 through bumping structures 8P, wherein a first (front) surface 1502F of the secondary die 1502 faces toward the primary die 1501, and a second surface 1502S of the secondary die 1502 faces away from the primary die 1501. Each bumping structures 8P includes an interfacial layer 6' (its composition is similar to the aforementioned interfacial layer 6) over the second surface 1502S of the secondary die 1502, an interfacial layer 6' disposed over each of the conductive vias 1513, a conductive pillar 8_a_ over the interfacial layer 6', and solder balls 8_b_" connecting between the aforesaid two conductive pillars 8_a_. Further, an underfill layer 1001 is formed to cover the sidewalls of the bumping structures 8P. In some embodiments, the underfill layer 1001 may be no-flow underfill and the underfill layer 1001 may be substantially free from being in direct contact with the primary die 1501. Further, a portion of the secondary die 1502 may be exposed through the underfill layer 1001. Note there exists a gap 1509 between both layers of copper-phosphorous alloy 7 over 1501S and 1502F for air convection.

A second structure 1500B includes tertiary die 1503, wherein the tertiary die 1503 is provided with one or more memory devices. In some embodiments, the tertiary die 1503 may be a DRAM die or a flash memory die. The second structure 1500B further includes a fan-out interposer FO (made by layers of ABF (prefer) or bismaleimide-triazine (BT) with an encapsulant or molding compound 1522 at least partially surrounding the tertiary die 1503 laterally, wherein the tertiary die 1503 has a first (front) surface 1503F and a second (back) surface 1503S opposite to the front surface 1503F. The molding compound 1522 may encapsulate at least one side surface of the tertiary die 1503. In some embodiments, the molding compound 1522 is made of epoxy molding compound EMC), polyimide (PI), or other suitable materials such as plastic or polymer materials. In some embodiments, the molding compound 1522 may be formed by molding techniques (such as injection molding), 3D printing, additive manufacturing, or the like. A plurality of the conductive vias 1523 and a plurality of grounding vias (or through vias) 1523' are arranged in the molding compound 1522 and laterally surrounded by the molding compound 1522. In some embodiments, the grounding vias 1523' are formed in a peripheral area of the molding compound 1522, and the conductive vias 1523 maybe between the grounding vias 1523' and the tertiary die 1503.

The second structure 1500B further includes a first RDL 1521_a_ and a second RDL 1521_b_ arranged on two opposing sides of the molding compound 1522, wherein the first RDL 1521_a_ is proximal to the second surface 1503S of the tertiary die 1503. In some embodiments, the second surface 1503S of the tertiary die 1503 is exposed through the first RDL 1521_a_. Further, a plurality of conductive pillars 8_a_ and alloy layers 8_b_ may be disposed on the first RDL 1521_a_ and the second RDL 1521_b_.

The first structure 1500A is bonded to the second structure 1500B through bumping structures 8P'. An underfill layer 1001 is formed to cover the sidewalls of the bumping structures 8P', wherein the underfill layer 1001 is between the second RDL 1521_b_ of the second structure 1500B and the RDL 1511 of the first structure 1500A. A plurality of thermal management structures TM, which includes an interfacial layer 6 and a copper-phosphorous alloy layer 7 (which may be made of $Cu_3P$) over the interfacial layer 6, are formed over the exposed surfaces of the primary, secondary or tertiary dies 1501, 1502, 1503 to obtain a package structure 1500C. For example, the thermal management structures TM are respectively formed over, and thermally coupled to, the first surface 1503F of the tertiary die 1503, the second surface 1501S of the primary die 1501, the first surface 1502F of the secondary die 1502, and the second surface 1502S of the secondary die 1502, thereby helping improve thermal dissipation of each of the aforesaid dies 1501, 1502, 1503. In some embodiments, the thermal management structures TM are further thermally coupled to the first surface 1502F of the secondary die 1502, the second surface 1502S of the secondary die 1502, a side surface of the underfill layer 1001 encapsulating the bumping structure 8P, and a side surface of the underfill layer 1001 encapsulating the bumping structure 8P'.

In some embodiments, the thermal management structure TM over the second surface 1502S of the secondary die 1502 further extends over the sidewalls of the underfill layer 1001 of the first structure 1500A, the sidewalls of the underfill layer 1001 of the second structure 1500B, the sidewalls of the RDL 1511 and the sidewalls of the molding compound 1512. The thermal management structure TM over the second surface 1501S of the primary die 1501 may further extend over the peripheral areas of the second RDL 1521_b_ and the molding compound 1512, thereby being electrically connected to the grounding vias 1513' of the first structure 1500A and the grounding vias 1523' of the second structure 1500B. The grounding vias 1523' and the grounding vias 1513' may have a same potential, thereby providing a reference voltage level. Such configuration of the thermal management structures TM may both improve thermal dissipation ability and provide the reference voltage level. Further, by using the electroless plating operation, the interfacial layer 6 of the thermal management structure TM disposed on each of the dies can be formed in a single operation, and the copper-phosphorous alloy layer 7 of the thermal management structure TM disposed on each of the dies can also be formed in a single operation. Embodiments of a package structure including multiple dies will be subsequently discussed with reference to FIG. 14, which is similar to the discussion with reference to FIG. 13, but the difference resides in that the thermal management structures are formed prior to connecting the first structure to the second structure.

Figure 14:
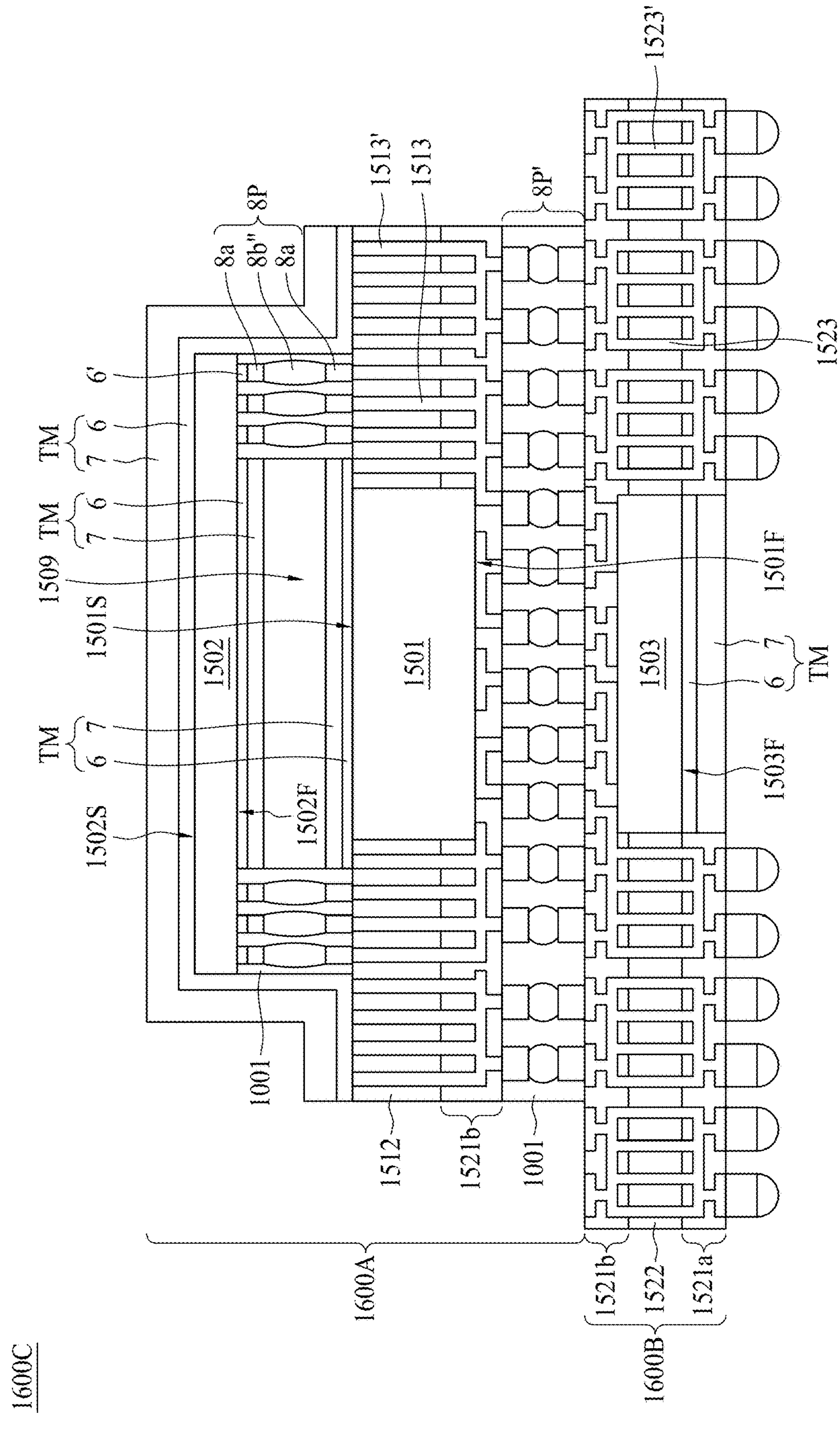
FIG. 14 is a cross-sectional view of a package structure, in accordance with some embodiments of the present disclosure.

Referring to FIG. 14, FIG. 14 is a cross-sectional view of a package structure, in accordance with some embodiments of the present disclosure. The first structure 1600A shown in FIG. 14 is similar to the first structure 1500A shown in FIG. 13, but the difference resides in that thermal management structures TM are formed over, and thermally coupled to, the second surface 1501S of the primary die 1501, the first surface 1502F of the secondary die 1502, and the second surface 1502S of the secondary die 1502. The aforesaid configuration help improve the thermal dissipation of each of the aforesaid dies 1501, 1502, 1503. Further, the thermal management structure TM over the second surface 1502S of the secondary die 1502 further extends over the sidewalls of the underfill layer 1001 of the first structure 1500A and over the peripheral areas of the molding compound 1512, thereby covering the grounding vias 1513'.

The second structure 1600B is bonded to the first structure 1600A to obtain a package structure 1600C. The package structure 1600C shown in FIG. 14 is similar to the package structure 1500C shown in FIG. 13, but the difference resides in that, in some cases, the thermal management structure TM over the second surface 1502S of the secondary die 1502 may not further extend over the peripheral areas of the second RDL 1521*b*. Note there exists a gap 1509 between both layers of copper-phosphorous alloy 7 over 1501S and 1502F for air convection.

Figure 15:
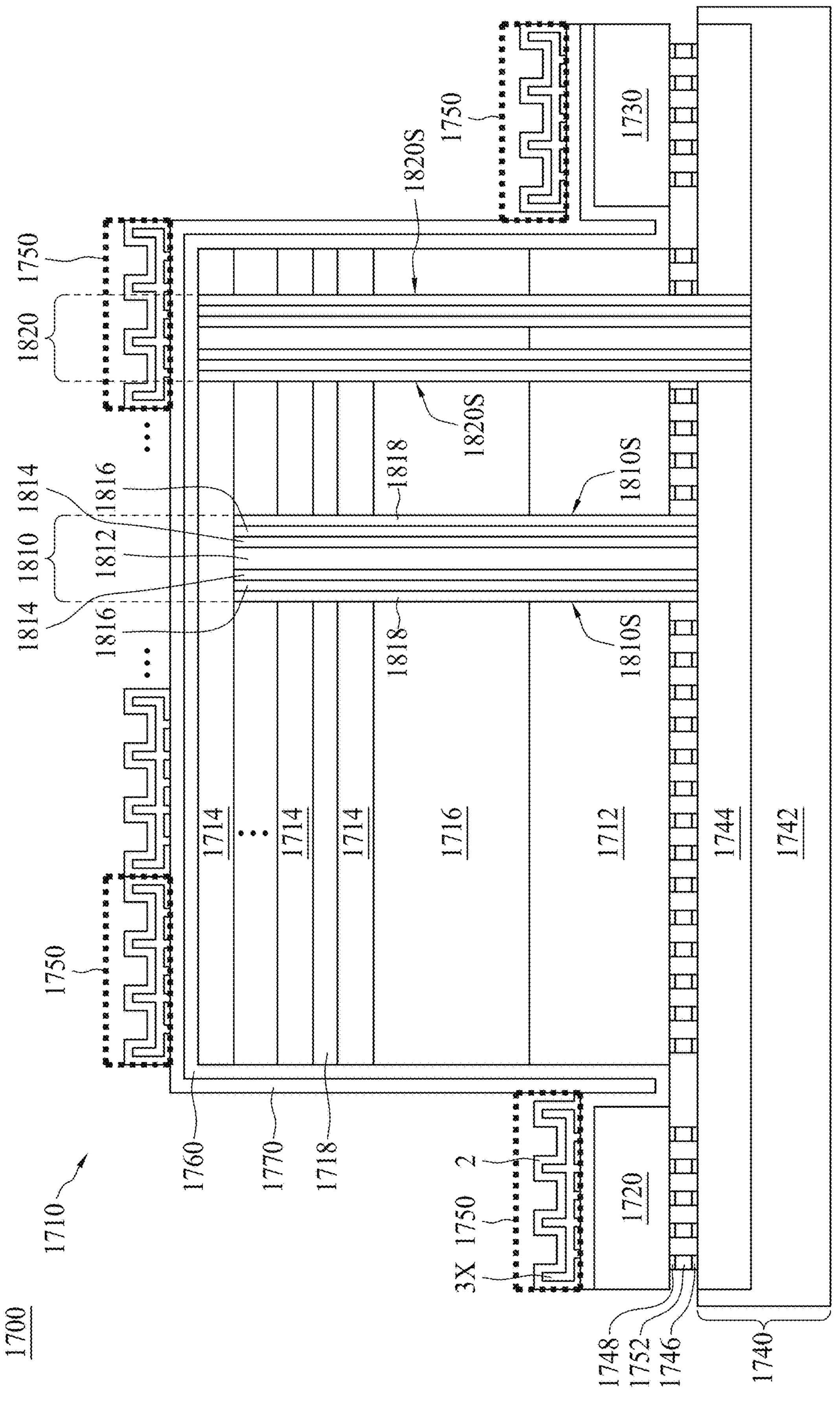
FIG. 15 is a cross-sectional view of a package structure, in accordance with some embodiments of the present disclosure.

FIG. 15 is a cross-sectional view of a package structure 1700, in accordance with some embodiments of the present disclosure. The package structure 1700 includes a first die 1710, a second die 1720, a third die 1730 and a substrate 1740. In some embodiments, the first die 1710 is a package die, and includes a first semiconductor device 1712 and a plurality of second semiconductor devices 1714 arranged in a stack. In some embodiments, the first semiconductor device 1712 is a logic die, and the second semiconductor devices 1714 are memory dies. The first die 1710 may further include a first RDL 1716 arranged between the first semiconductor device 1712 and a lowest second semiconductor device 1714. Further, the first die 1710 includes one or more second RDLs 1718 between two adjacent second semiconductor devices 1714. The second semiconductor devices 1714 are alternatively arranged with the second RDLs 1718. The aforesaid components of first die 1710 are stacked, e.g., the first semiconductor device 1712, the first RDL 1716, a first one of the second semiconductor devices 1714, a first one of the second RDLs 1718, a second one of the second semiconductor devices 1714, a second one of the second RDLs 1718, until an N-th second semiconductor device 1714 (N being the number of the second semiconductor devices 1714), and are bonded to construct the first die 1710.

In some embodiments, the second die 1720 is a wireless transceiver die, which includes at least one of a transceiver, a memory chip, an antenna and an RF device. In some embodiments, the third die 1730 is a sensor die, which includes at least one of a sensor device, a memory chip and an analog circuit.

The substrate 1740 may include a first layer 1742 and a second layer 1744 over the first layer 1740. In some embodiments, the first layer 1742 serves as a ground layer of the package structure 1700 and is formed of ceramics, silicon, glass or any other suitable materials. In some embodiments, the second layer 1744 is an RDL or an interconnect layer configured to electrically interconnect the first die 1710, the second die 1720 and the third die 1730.

In some embodiments, the package structure 1700 further includes conductive bumps 1746 arranged on an upper side of the second layer 1742 of the substrate 1740. The package structure 1700 may further includes conductive bumps 1748 arranged on a lower side of each of the first die 1710, the second die 1720 and the third die 1730. Each of the conductive bumps 1746 may align with the corresponding conductive bumps 1748. The conductive bumps 1746 and 1748 may be micro bumps, C4 bumps, or the like. The package structure 1700 further includes conductive pillars 1752 to electrically connect the bumps 1746 and the corresponding bumps 1748 for electrically coupling the substrate 1740 to the first die 1710, the second die 1720 and the third die 1730. In some embodiments, the conductive pillars 1752 are omitted, and the conductive bumps 1746 are bonded directly to the corresponding conductive bumps 1748.

In some embodiments, the package structure 1700 further includes a UBM layer 1760 over upper surfaces and sidewalls of the first die 1710, the second die 1720 and third die 1730. In some embodiments, the material, configuration and method of forming of the UBM layer 1760 are similar to those of the UBM layer 1U described with reference to FIGS. 5A to 5D. In some other embodiments, the UBM layer 1760 is formed of a first sublayer and a second sublayer over the first sublayer, wherein the first sublayer is similar to the adhesion layer 1*a* described with reference to FIGS. 1, 2 and 5A to 5D, and the second sublayer is similar to the diffusion barrier layer 1*b* described with reference to FIGS. 1, 2 and 5A to 5D. In some embodiments, the package structure 1700 further includes a copper-phosphorous alloy layer 1770 formed over the UBM layer 1760. The copper-phosphorous alloy layer 1770 may be deposited over the upper surfaces and sidewalls of the first die 1710, the second die 1720 and third die 1730. The material, function, configuration, and method of forming of the copper-phosphorous alloy layer 1770 are similar to those of the copper-phosphorous alloy layer 1*c* described with reference to FIGS. 1, 2 and 5A to 5D. In some embodiments, the antennas, RF devices or other components of the second die 1720 or the third die 1730 for transmitting or receiving electromagnetic waves are exposed through the UBM layer 1760, the copper-phosphorous alloy layer 1770 and the thermal management structures 1750 to ensure proper functions of the antennas, the RF devices or the like.

In some embodiments, each of the first die 1710, the second die 1720 and third die 1730 is provided with a thermal management structure 1750, where the thermal management structure 1750 includes a heat spreader 3X over an upper surface (back surface) of each of the first die 1710, the second die 1720 and third die 1730. The heat spreader 3X may be formed over the upper surface of the copper-phosphorous alloy layer 1770. In some embodiments, the thermal management structure 1750 further includes a copper-phosphorous alloy material layer 2 deposited on the surfaces and gaps of the respective heat spreader 3X. The heat spreader 3X and the copper-phosphorous alloy material layer 2 may be similar to those heat spreader 3X and the copper-phosphorous alloy material layer 2 described with reference to FIGS. 3, 4, 8, 9A, 9B and 10.

In some embodiments, the first die 1710 further includes a plurality of through package vias 1810 and a second through package vias 1820 extending through the package of the first die 1710 (FIG. 15 only illustrates two exemplary through package vias 1810 and 1820). The through package vias 1810 may be used as signal paths configured to electrically connect the first semiconductor device 1712 and the second semiconductor devices 1714 to the second layer 1744 of the substrate 1740. The first semiconductor device 1712, the second semiconductor devices 1714, the first RDL 1716 and the second RDL 1718 may include conductive lines electrically coupled to the through package vias 1810 for transmitting signals. The through package vias 1820 may be used as grounding paths configured to electrically connect the first semiconductor device 1712 and the second semiconductor devices 1714 to the first layer 1742 of the substrate 1740 for grounding. The first semiconductor device 1712, the second semiconductor devices 1714, the first RDL 1716 and the second RDL 1718 may include conductive lines for grounding by connecting to the through package vias 1820.

In some embodiments, each of the through package vias 1810 and 1820 includes a core layer 1812, a wetting layer 1814 and a diffusion barrier layer 1816. In some embodiments, the core layer 1812 is formed of a conductive material, such as copper, tungsten, aluminum, or the like, and configured to conduct the electrical path or the grounding path of the through package vias 1810, 1820. In some embodiments, the wetting layer 1814 is formed of a copper-phosphorous alloy layer and laterally surrounds the core layer 1812. The copper-phosphorous alloy layer 1814 may improve the wettability of the material of the core layer 1812. In some embodiments, the diffusion barrier layer 1816 is formed of transitional metal or a nitride thereof, e.g., titanium and titanium nitride, and laterally surrounds the wetting layer 1814 and the core layer 1812. In some embodiments, the through package vias 1810, 1820 are defined by sidewalls 1810S or 1820S formed on the first die 1710. In some embodiments, a liner layer 1818 is lined to the sidewalls 1810S or 1820S between the diffusion barrier layer 1816 and the first die 1710 or the through package vias 1810, 1820, and laterally surrounds the diffusion barrier layer 1816, the copper-phosphorous alloy layer 1814 and the core layer 1812. The liner layer 1818 may be formed of a dielectric material, e.g., oxide or nitride, and configured to electrically insulate the diffusion barrier layers 1816 from the semiconductor substrate of the first die 1710. Although the depicted example only shows the copper-phosphorous alloy layer serving as the wetting layer 1814 of the through package via 1810 or the through package via 1820, the wetting layer 1814 formed of the copper-phosphorous alloy layer can also be applied to other types of through vias, such as through molding vias, through silicon vias, through substrate vias, or the like.

In some embodiments, a top of the through package vias 1820 extends through the topmost second semiconductor devices 1714 and is coupled to the lower surface of the UBM layer 1760. In some embodiments, a top of the through package vias 1810 extends to the lower surface of the topmost second semiconductor device 1714 and is separated from the UBM layer 1760 by the topmost second semiconductor device 1714 to avoid abnormal short circuit of the signal paths.

In some embodiments, an example method of forming the package structure 1700 is provided below. The substrate 1740 is provided with a plurality of insulating layers and conductive line layers to form one or more conduction paths, in which the signal path is provided in the second layer 1744 while the grounding path is provided in the first layer 1742. Subsequently, conductive bumps 1746 are formed on an upper side of the substrate 1740. In some embodiments, conductive through vias (e.g., a lower portion of the through package via 1820) are formed through the second layer 1744 of the substrate 1740 to be electrically connected to the first layer 1742.

The first die 1710 is provided. For example, the first semiconductor device 1712 and the second semiconductor devices 1714 are formed on one or more wafer substrates and cut into individual dies. Further, the first RDL 1716 and the second RDLs 1718 are also formed on one or more wafer substrates and cut into individual dies. In some embodiments, portions of the through package vias 1810 and 1820 are formed in each of the first semiconductor device 1712, the second semiconductor devices 1714, the first RDL 1716 and the second RDLs 1718. Each of the aforementioned components of the first die 1710 may be aligned and bonded to each other through a suitable bonding process, e.g., thermal compression bonding (TCB), hybrid bonding, fusion bonding, or the like. The different portions of the through package vias 1810 and 1820 in the first semiconductor device 1712, the second semiconductor devices 1714, the first RDL 1716 and the second RDLs 1718 are electrically coupled together to form vertically-extending through vias 1810, 1820.

The second die 1720 and the third die 1730 may be provided. Further, conductive bumps 1748 may be formed on lower sides of the first die 1710, the second die 1720 and the third die 1730, and are bonded to the substrate 1740 through bonding of the conductive bumps 1746 and 1748. The UBM layer 1760 and the copper-phosphorous alloy layer 1770 are successively deposited on the upper surfaces and sidewalls of the first die 1710, the second die 1720 and the third die 1730. The heat spreaders 3X are arranged over the first die 1710, the second die 1720 and the third die 1730 and on the copper-phosphorous alloy layer 1770. The copper-phosphorous alloy material layer 2 are deposited on the surface and gaps of the heat spreaders 3X to form the thermal management structures 1750. The package structure 1700 is thus completed.

In the present disclosure, a means for thermal management (such as improving thermal dissipation) are provided for various types of package structures or semiconductor structures, as respectively discussed with reference to FIG. 1 to FIG. 14. The compatibility of operations for improving thermal dissipation allows incorporation thereof into various types of the operations for forming the package structures or semiconductor structures. A means for thermal management in the present disclosure includes, but not limited to, the thermal management structure 1, the heat spreaders (such as heat spreaders 3, 3X, or 3Y), the copper-phosphorous alloy material layer 2, the thermal management structures TM including an interfacial layer 6 and a copper-phosphorous alloy layer 7 (which may be made of $Cu_3P$), the thermal management auxiliary unit 4 or a combination thereof. As discussed with reference to FIG. 1 and FIG. 2, the thermal management structure 1 (which includes the adhesion layer 1*a*, the diffusion barrier layer 1*b* over the adhesion layer 1*a*, and the copper-phosphorous alloy layer 1*c* (which may include $Cu_3P$) over the diffusion barrier layer 1*b*) is utilized for thermal management that can improve thermal dissipation. The adhesion layer 1*a* can enhance adhesion between the thermal management structure 1 and the substrate. The diffusion barrier layer 1*b* can be utilized to alleviate diffusion, and may be able to decrease internal stress. The copper-phosphorous alloy layer 1*c* exhibits greater thermal conductivity compared to conventional thermal dissipation plates and conventional thermal interface materials, and has a more condensed structure, and can improve anti-corrosion, wear resistance, wettability, strength, toughness, conformability, processability, et cetera. Further, embodiments in FIG. 2 further include forming the plurality of protrusions 1*d* to further improving ability to dissipate heat. The thermal management structure 1 can further be incorporated into a package structure as discussed with reference to FIG. 5A; specifically, common materials between the thermal management structure 1 formed at a back of a substrate and a UBM layer 1U of a pillar can be formed in a single operation.

Referring to FIG. 3 and FIG. 4, the thermal management auxiliary unit 4 are provided, which includes the thermal management structure 1, the copper-phosphorous alloy material layer, and one or more heat spreaders 3. The configuration of the heat spreaders 3 has a greater surface area for dissipating heat, and the incorporation of the copper-phosphorous alloy material layer 2 formed on the heat spreaders 3 helps improve thermal management and adhesion of the heat spreaders 3.

The thermal management structure TM, which includes an interfacial layer 6 and a copper-phosphorous alloy layer 7, can be used in a package structure to improve thermal dissipation (or thermal management). For example, operations for forming the package structures discussed with reference to FIG. 6 (the thermal management structure TM formed over one or more dies disposed in a molding compound) and FIG. 7A to FIG. 7F (multiple dies stacked in the vertical direction).

Multiple heat spreaders (such as the heat spreaders 3, 3X, or 3Y) and the copper-phosphorous alloy material layer 2 formed thereon as well as the thermal management structure TM under the heat spreaders can be further incorporated into the operations for forming the package structures in order to improve thermal dissipation (or thermal management). Further examples can be seen in FIG. 8 (increasing the thickness of the entire pillars to avoid interference), FIG. 9A, FIG. 9B, and FIG. 10 (connecting the first die and the second die in a horizontal direction).

Efficient ways to incorporate the thermal management structures TM into the package structures that include multiple dies stacked in the vertical direction are discussed with reference to FIG. 11, FIG. 13, and FIG. 14. For example, FIG. 11 exhibits a two-die configuration, and further uses the thermal management structures TM to cover the grounding vias for certain applications. FIG. 13 and FIG. 14 show the package structures with three or more dies stacked together, wherein the time when the thermal management structures TM are formed may be adjusted based on the applications. Further, one of the thermal management structure(s) TM may further connect the grounding vias apart from the dies, thereby providing a reference voltage level. FIG. 12 further shows incorporation of one or more heat spreaders (such as the heat spreaders 3, 3X, or 3Y) and the copper-phosphorous alloy material layer 2 formed on the heat spreaders to further improve the ability of thermal dissipation or thermal management.

Figure 2:
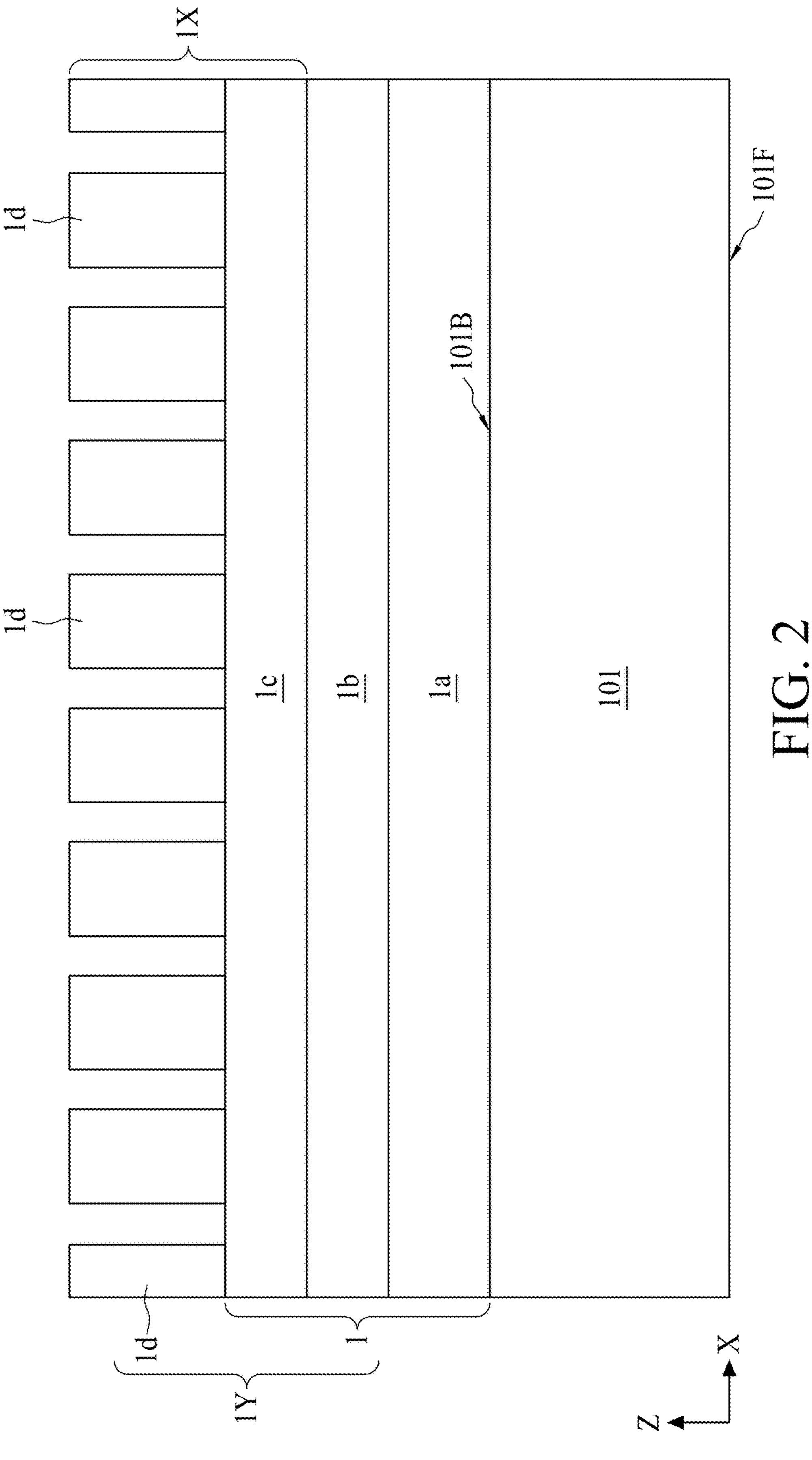
FIG. 2 is a cross-sectional view of a semiconductor structure, in accordance with some embodiments of the present disclosure.

In some embodiments, although not separately illustrated, the thermal management structures TM discussed in the present disclosure, e.g., shown in FIGS. 7B, 7E, 7F, 11, 13 and 14, can be arranged to include protrusions 1*d*, in a form similar to the protrusions 1*d* shown in FIG. 2. The protrusions 1*d* may include copper-phosphorous alloy material similar to the copper-phosphorous alloy layer 7. In some embodiments, the corrugated profile of the thermal management structure TM includes a planar portion 7 and a corrugated portion 1*d* over the planar portion 7.

In addition, the aforementioned techniques can be applied to various technology nodes and various types of technology generations. For example, the techniques discussed above can be further applied to 2.5D and 3D package structures.

Some embodiments of the present disclosure provide a package structure. The package structure includes: a first die having a first front surface and a first back surface opposite to the first front surface; a second die having a second front surface and a second back surface opposite to the second front surface, wherein the first back surface faces the first front surface; and a first thermal management structure over the first back surface. The first thermal management structure includes a first copper-phosphorous alloy layer thermally coupled to and covering an entirety of the first back surface.

Some embodiments of the present disclosure provide a package structure. The package structure includes: a first die having a first front surface and a first back surface opposite to the first front surface; a second die arranged over the first die, the second die having a second front surface and a second back surface opposite to the second front surface; a first bumping structure electrically connecting the first die and the second die; and a first thermal management structure over the first back surface and the second back surface. The first thermal management structure includes a first copper-phosphorous alloy layer thermally coupled to the second back surface.

Some embodiments of the present disclosure provide a package structure. The package structure includes: a first die having a first front surface and a first back surface opposite to the first front surface; a second die arranged over the first die, wherein the second die includes a second front surface and a second back surface opposite to the second front surface; a first bumping structure electrically connecting the first die and the second die; and a copper-phosphorous alloy layer over the first back surface and the second back surface.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A package structure, comprising:
- a first die;
- a second die arranged over the first die;
- an under-bump metallization (UBM) layer covering a back surface of the second die and a side surface of the first die; and
- a first through via extending through the first die and the second die, wherein a top surface of the first through via directly contacts a lower surface of the UBM layer.

2. The package structure of claim 1, further comprising:
- a first copper-phosphorous alloy layer covering the UBM layer,
- wherein the UBM layer comprises:
- an adhesion layer covering the back surface of the second die and the side surface of the first die; and
- a diffusion barrier layer between the adhesion layer and the first copper-phosphorous alloy layer.

3. The package structure of claim 1, further comprising:

a first thermal management structure over the first die and the second die, the first thermal management structure comprising:

a fin-shaped first heat spreader over the UBM layer; and a second copper-phosphorous alloy layer over the fin-shaped first heat spreader.

4. The package structure of claim 1, further comprising:

a third die disposed adjacent to the first die and the second die, wherein the UBM layer further covers a top surface and a side surface of the third die.

5. The package structure of claim 4, further comprising:

a second thermal management structure over the third die, the second thermal management structure comprising:

a second heat spreader over the UBM layer; and a fourth copper-phosphorous alloy layer over the second heat spreader.

6. The package structure of claim 1, further comprising a second through via extending through the first die, wherein a top of the second through via extends to a lower surface of the second die and is separated from the UBM layer.

7. The package structure of claim 1, further comprising a redistribution layer arranged between the first die and the second die.

8. A package structure, comprising:

a first die;

a second die arranged over the first die;

an under-bump metallization (UBM) layer covering a back surface of the second die and a side surface of the first die; and a first through via extending through the first die and the second die, wherein a top of the first through via is coupled to the UBM layer, and wherein the first through via comprises:

a core layer comprising a conductive material; and a wetting layer comprising a copper-phosphorous alloy layer laterally surrounding the core layer.

9. A package structure, comprising:

a first die;

a second die arranged over the first die;

an under-bump metallization (UBM) layer covering a back surface of the second die and a side surface of the first die;

a first through via extending through the first die and the second die, wherein a top of the first through via is coupled to the UBM layer;

a second through via extending through the first die, wherein a top of the second through via extends to a lower surface of the second die and is separated from the UBM layer; and a substrate under the first die and the second die, the substrate comprising:

a ground layer electrically connected to the first through via; and an interconnect layer over the ground layer and electrically connected to the second through via.

* * * * *